(12) United States Patent
Maruyama

(10) Patent No.: US 12,009,425 B2
(45) Date of Patent: Jun. 11, 2024

(54) SEMICONDUCTOR DEVICE AND METHOD OF MANUFACTURING THE SAME

(71) Applicant: RENESAS ELECTRONICS CORPORATION, Tokyo (JP)

(72) Inventor: Takahiro Maruyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 226 days.

(21) Appl. No.: 17/521,041

(22) Filed: Nov. 8, 2021

(65) Prior Publication Data

US 2022/0149206 A1 May 12, 2022

(30) Foreign Application Priority Data

Nov. 12, 2020 (JP) .................................. 2020-188455

(51) Int. Cl.
*H01L 29/78* (2006.01)
*H01L 29/66* (2006.01)
*H01L 51/30* (2006.01)
*H10B 51/30* (2023.01)

(52) U.S. Cl.
CPC .. *H01L 29/78391* (2014.09); *H01L 29/66795* (2013.01); *H01L 29/6684* (2013.01); *H01L 29/7851* (2013.01); *H10B 51/30* (2023.02)

(58) Field of Classification Search
CPC ......... H01L 29/78391; H01L 29/66795; H01L 29/6684; H01L 29/7851; H01L 29/40111; H01L 29/516; H10B 51/30
USPC ........................................................ 257/295
See application file for complete search history.

(56) References Cited

U.S. PATENT DOCUMENTS

| 6,087,687 A | 7/2000 | Katoh |
| 9,853,150 B1 | 12/2017 | Colinge et al. |
| 2007/0272959 A1 | 11/2007 | Hidaka et al. |
| 2011/0316059 A1* | 12/2011 | Ahn ................ H01L 29/78391 257/295 |
| 2012/0007158 A1* | 1/2012 | Yoon .................... H01L 29/516 257/295 |
| 2012/0086059 A1* | 4/2012 | Dubourdieu .... H01L 21/823412 257/295 |

(Continued)

FOREIGN PATENT DOCUMENTS

| JP | H9-307072 A | 11/1997 |
| JP | 2019-201172 A | 11/2019 |

OTHER PUBLICATIONS

Partial European Search Report issued in corresponding European Patent Application No. 21207618.6-1212, dated Apr. 12, 2022.

(Continued)

*Primary Examiner* — Sheikh Maruf
(74) *Attorney, Agent, or Firm* — Rimon P.C.

(57) ABSTRACT

A semiconductor device includes a ferroelectric memory having a ferroelectric film between a gate electrode and a semiconductor substrate. The ferroelectric film and a metal film are not formed just above an element isolation region formed in a trench in an upper surface of the semiconductor substrate, but are formed on the semiconductor substrate in the active region defined by the element isolation region to prevent a state in which a polarization state in the ferroelectric film of the active region and a polarization state in the ferroelectric film on the element isolation region differ from each other.

7 Claims, 18 Drawing Sheets

(56) References Cited

U.S. PATENT DOCUMENTS

| | | | |
|---|---|---|---|
| 2013/0270619 A1* | 10/2013 | Schloesser | H01L 29/78391 257/295 |
| 2014/0070289 A1 | 3/2014 | Tanaka et al. | |
| 2014/0070290 A1* | 3/2014 | Inumiya | H10B 51/20 257/295 |
| 2015/0179657 A1 | 6/2015 | Inumiya | |
| 2015/0206893 A1* | 7/2015 | Sun | H10B 53/30 257/532 |
| 2015/0340372 A1* | 11/2015 | Pandey | H10B 51/30 257/295 |
| 2016/0035856 A1* | 2/2016 | van Bentum | H01L 21/823462 257/295 |
| 2016/0064228 A1* | 3/2016 | van Bentum | H01L 29/516 257/295 |
| 2016/0064510 A1* | 3/2016 | Mueller | H01L 29/78391 257/295 |
| 2016/0071947 A1* | 3/2016 | Wiatr | H01L 29/516 257/295 |
| 2016/0111549 A1* | 4/2016 | Baars | H01L 21/823462 257/295 |
| 2018/0138192 A1* | 5/2018 | Shin | H10B 43/40 |
| 2018/0366471 A1* | 12/2018 | Harari | H10B 43/30 |
| 2019/0259769 A1* | 8/2019 | Karda | H01L 27/0733 |
| 2019/0304988 A1* | 10/2019 | Dong | H10B 51/30 |
| 2019/0348424 A1* | 11/2019 | Karda | H10B 51/20 |
| 2019/0355584 A1 | 11/2019 | Yamaguchi | |
| 2020/0098779 A1* | 3/2020 | Cernea | H01L 23/5283 |
| 2020/0176468 A1* | 6/2020 | Herner | H10B 43/50 |
| 2020/0258897 A1* | 8/2020 | Yan | H01L 21/32053 |
| 2021/0366544 A1* | 11/2021 | Harari | H10B 43/27 |

OTHER PUBLICATIONS

S. Migita et al., "Low Voltage Operation of Ferroelectric-Gate FETs using HfO2 Ferroelectrics", The 79th Japan Society of Applied Physics Autumn Meeting 2018, 20p-141-11, with English translation.

Office Action issued on Dec. 19, 2023 in the corresponding Japanese patent application No. 2020-188455, with machine translation.

\* cited by examiner

SEMICONDUCTOR DEVICE AND METHOD OF MANUFACTURING THE SAME

CROSS-REFERENCE TO RELATED APPLICATION

The disclosure of Japanese Patent Application No. 2020-188455 filed on Nov. 12, 2020 including the specification, drawings and abstract is incorporated herein by reference in its entirety.

BACKGROUND

The present invention relates to a semiconductor device and a manufacturing method of the same, and more particularly relates to a technique effective when applied to a semiconductor device used as a storage element that uses a ferroelectric film, and a manufacturing method of such a semiconductor device.

In recent years, a ferroelectric memory using a ferroelectric material has been developed as a semiconductor storage element that can operate at a low voltage. The ferroelectric memory is a nonvolatile storage element that controls a direction of polarization of the ferroelectric material to change write and erase states of information.

A fin type transistor is known as a field effect transistor having a high operating speed, low leakage current and low power consumption, and capable of being miniaturized. For example, the fin type transistor (FINFET: Fin Field Effect Transistor) has a plate-like (wall-like) semiconductor layer pattern protruding from a substrate as a channel layer, and is a semiconductor element having a gate electrode formed so as to extend over the pattern.

There are Disclosed Techniques Listed Below

[Non-patent Document 1] The 79th JSAP (Japan Society of Applied Physics) Autumn Meeting (Autumn 2018), 20p-141-11, Shinji Migita, et al.

Non-patent Document 1 describes a ferroelectric memory having a MFMIS structure in which an insulating film (I), a lower metal film (M), a ferroelectric film (F) and an upper metal film (M) are stacked in this order on a silicon substrate (S). Here, it is described that a ratio of an area of an interface between the ferroelectric film and the upper metal film with respect to an area of an interface between the insulating film and the lower metal film is reduced to enhance an electric field applied to the ferroelectric film.

SUMMARY

In a ferroelectric memory, an electric field applied to a ferroelectric film on an element isolation region is weak, whereby it would be difficult to invert a polarization in the ferroelectric film on the element isolation region. For this reason, there may be a case where the polarization on the element isolation region is inverted from a polarization on an active region. In such a case, it would be difficult to retain a polarization state on the active region, whereby deterioration of retention characteristics (retention) can occur.

Other problems and novel characteristics will be apparent from the description in the present specification and accompanying drawings.

The following is a brief overview of a representative embodiment among the embodiments disclosed in the present application.

The semiconductor device according to one embodiment has a ferroelectric film formed on the active region without forming the ferroelectric film just above the element isolation region on an upper surface of the semiconductor substrate.

According to one embodiment disclosed in the present application, performance of the semiconductor device can be enhanced.

BRIEF DESCRIPTIONS OF THE DRAWINGS

DETAILED DESCRIPTION

In the embodiments described below, the invention will be described in a plurality of sections or embodiments if necessary for the sake of convenience. However, these sections or embodiments are not irrelevant to each other unless otherwise clearly specified, and one section or embodiment partially or entirely corresponds to another section or embodiment as a modification example, detailed or supplementary description, or the like. In addition, in the embodiments described below, when referring to the number of a component (including number of pieces, numerical value, amount and range), the number is not limited to a specified number and may be less than or greater than this number unless otherwise clearly specified or unless it is obvious from the context that the number is limited to the specified number in principle.

Furthermore, in the embodiments described below, it goes without saying that each component (including an element step) is not indispensable unless otherwise clearly specified or unless it is obvious from the context that the component is indispensable in principle. Likewise, in the embodiments described below, when referring to a shape, a positional relation or the like of a component, a substantially approximate shape, a similar shape or the like is included unless otherwise clearly specified or unless it is obvious from the context that the shape, the positional relation or the like of the component differs in principle. The same applies to the above-described numerical value and range.

Hereinafter, embodiments of the present invention will be described in detail with reference to the drawings. Note that, in all of the drawings used to describe the embodiments, members having the same functions are denoted by the same reference signs, and redundant descriptions thereof are omitted as appropriate. In addition, in the embodiments described below, descriptions of the same or similar portions are generally not repeated unless otherwise necessary.

First Embodiment

<Room for Improvement>

Figure 33:
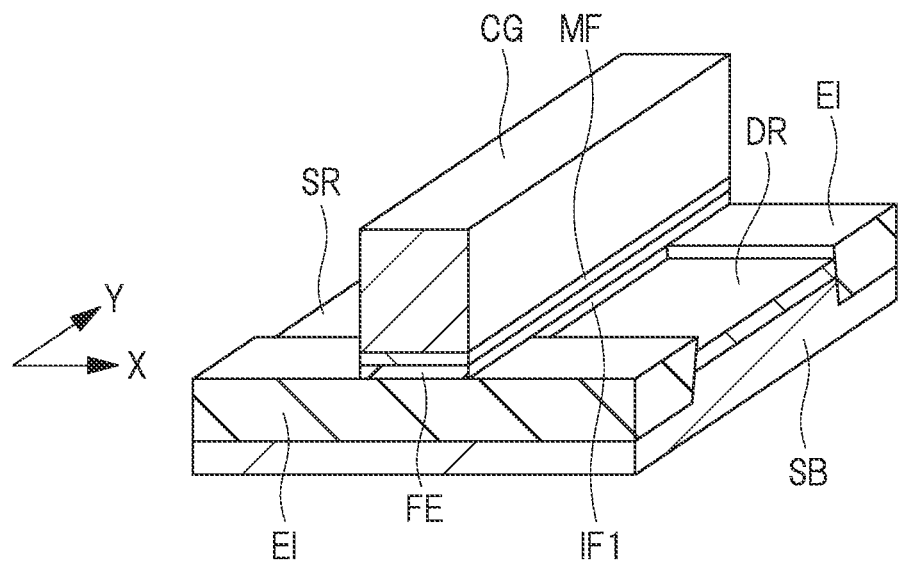
FIG. 33 is a perspective view showing a semiconductor device of a comparative example.
Figure 34:
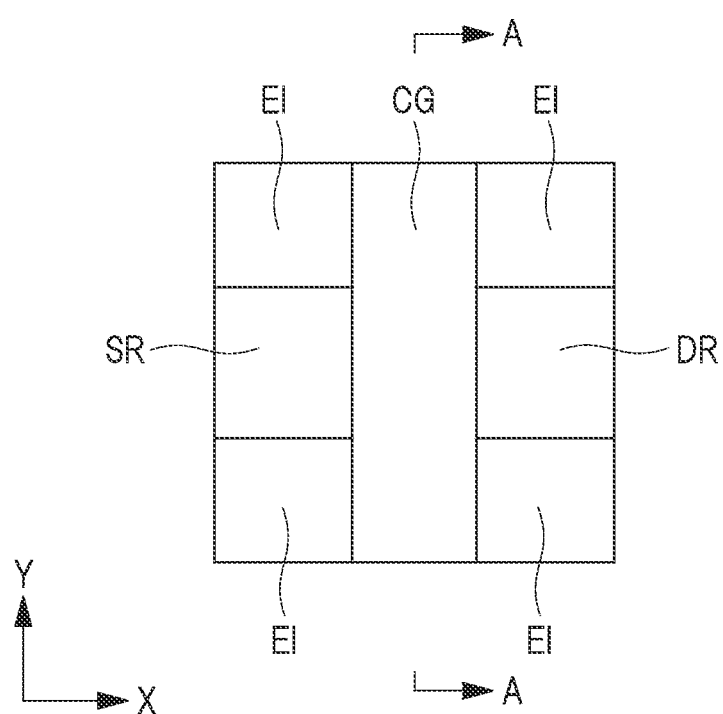
FIG. 34 is a plan view showing the semiconductor device of the comparative example.
Figure 35:
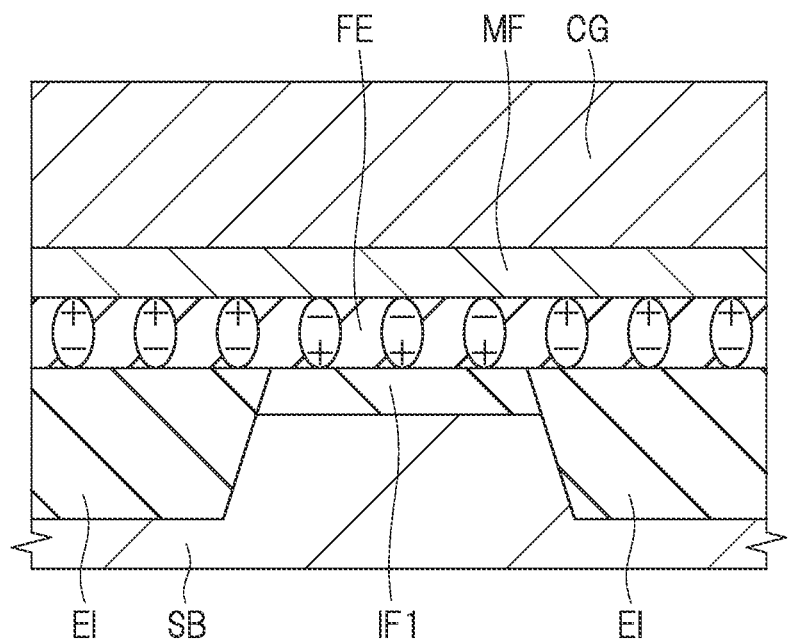
FIG. 35 is a cross-sectional view taken along a line A-A of FIG. 34.

Hereinafter room for improvement that a ferroelectric memory of a comparative example has will be described with reference to FIGS. 33 to 35. FIG. 33 is a perspective view showing the ferroelectric memory of the comparative example. FIG. 34 is a plan view showing the ferroelectric memory of the comparative example. FIG. 35 is a cross-sectional view taken along a line A-A of FIG. 34.

As shown in FIGS. 33 to 35, the ferroelectric memory of the comparative example is formed on an upper portion of a semiconductor substrate SB. A plurality of trenches are formed in an upper surface of the semiconductor substrate SB, and an element isolation region EI constituted by an insulator is embedded in each of the trenches. Between two element isolation regions, the upper surface of the semiconductor substrate SB which is an active region is exposed from the element isolation region EI. The active region extends in an X direction. A control gate electrode CG extends in a Y direction so as to extend over the two element isolation regions EI and over the active region. The X direction and the Y direction are directions orthogonal to each other, and are directions along the upper surface of the semiconductor substrate SB.

An insulating film IF1 which is a gate insulating film is formed on the upper surface of the semiconductor substrate SB in the active region just below the control gate electrode CG. A ferroelectric film FE and a metal film MF are formed in this order on the semiconductor substrate SB between the control gate electrode CG and the insulating film IF1, and between the control gate electrode CG and the element isolation region EI. In plan view, a source region SR and a drain region DR which are, for example, n type semiconductor regions are formed in the upper surface of the semiconductor substrate SB in the active region so as to sandwich the control gate electrode CG.

When a voltage is applied to the control gate electrode CG such that an electrical field (electric field) is applied to the ferroelectric film FE, dielectric polarization occurs in the ferroelectric film FE, and the polarization does not become zero even if the electrical field (electric field) is removed. In this manner, a direction of polarization of the ferroelectric film FE is controlled to control a voltage (threshold voltage) at which a predetermined current starts to flow between the source region SR and the drain region DR such that the ferroelectric memory can be used as a storage element.

FIG. 35 shows the polarization in the ferroelectric film FE on the active region when a voltage greater than 0 V is applied to the control gate electrode CG. As shown in FIG. 35, in the ferroelectric film FE on the active region, a portion on the semiconductor substrate SB side is positively charged, a portion on the control gate electrode CG side is negatively charged, and polarization occurs this manner. However, the electric field applied to the ferroelectric film FE on the element isolation region EI is weaker than on the active region. For this reason, it would be difficult to invert the polarization in the ferroelectric film FE on the element isolation region EI. As a result, there may be a case where the polarization on the element isolation region EI is inverted from the polarization on the active region. In such a case, it would be difficult to retain a polarization state on the active region, whereby deterioration of retention characteristic's (retention) can occur. In such a case, there may also be a problem in which an erroneous write or read (disturbance) occurs.

FIG. 35 shows the polarization when a positive voltage is applied to the control gate electrode CG. Contrary to FIG. 35, in the ferroelectric film FE on the active region, when a negative voltage is applied to the control gate electrode CG, the portion on the semiconductor substrate SB side is negatively charged, the portion on the control gate electrode CG side is positively charged, and polarization occurs in this manner. However, in this case also, it would be difficult to invert the polarization in the ferroelectric film FE on the element isolation region EI. For this reason, the polarization on the element isolation region EI is easily inverted from the polarization on the active region.

Thus, in the ferroelectric memory in which the ferroelectric film FE is formed over the element isolation region EI, it would be difficult to control the polarization state on the element isolation region EI, and there is room for improvement regarding a decrease in performance of the ferroelectric memory caused by the above.

<Layout Configuration Example of Semiconductor Chip>

Figure 1:
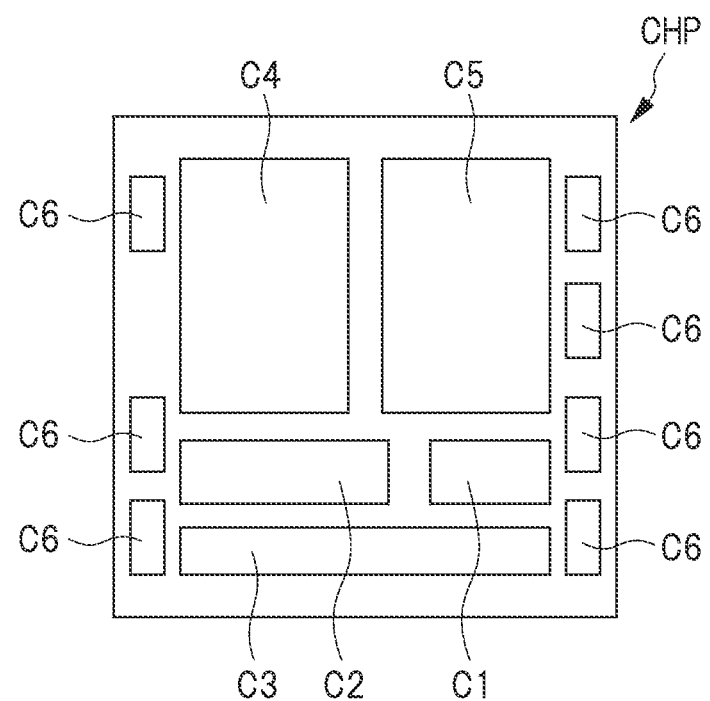
FIG. 1 is a schematic view showing a layout configuration of a semiconductor chip on which a semiconductor device according to a first embodiment of the present invention is mounted.
Figure 2:
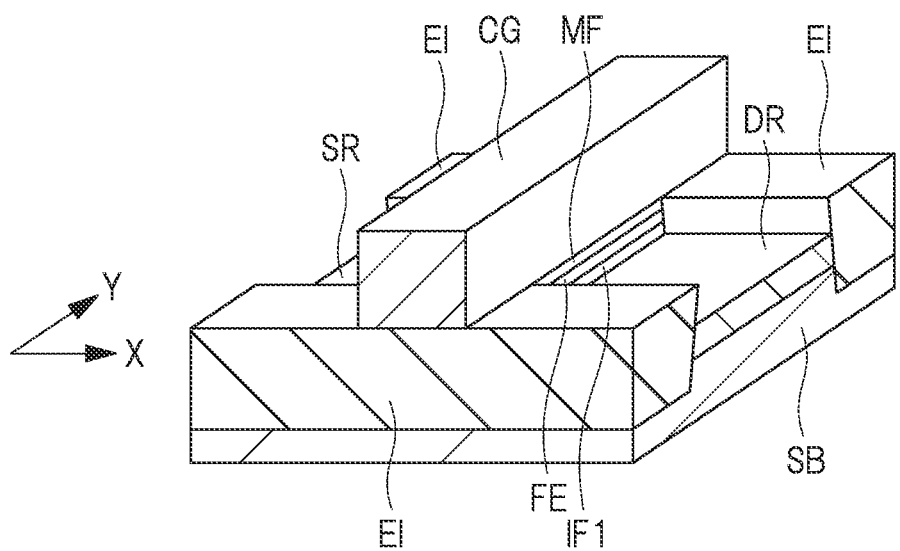
FIG. 2 is a perspective view showing the semiconductor device according to the first embodiment of the present invention.
Figure 3:
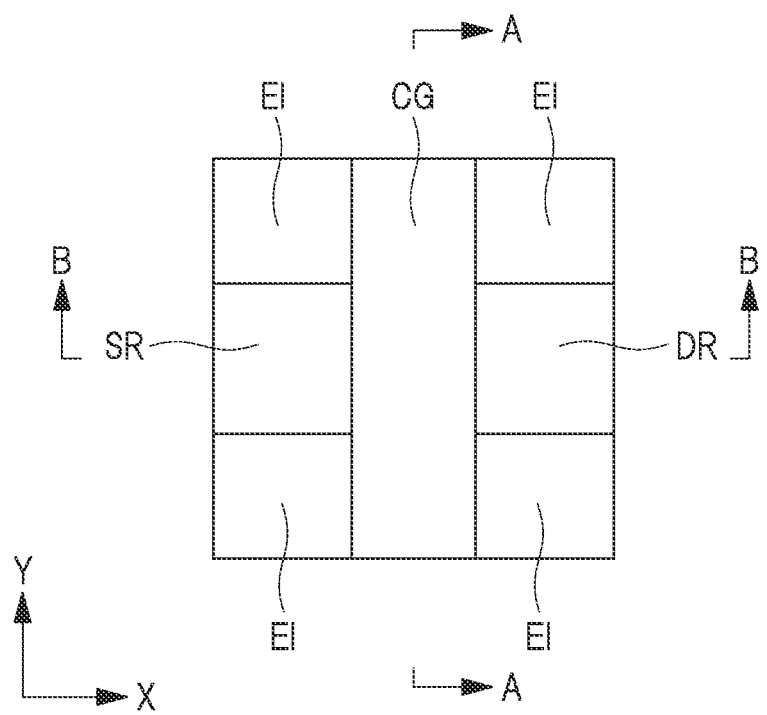
FIG. 3 is a plan view showing the semiconductor device according to the first embodiment of the present invention.
Figure 4:
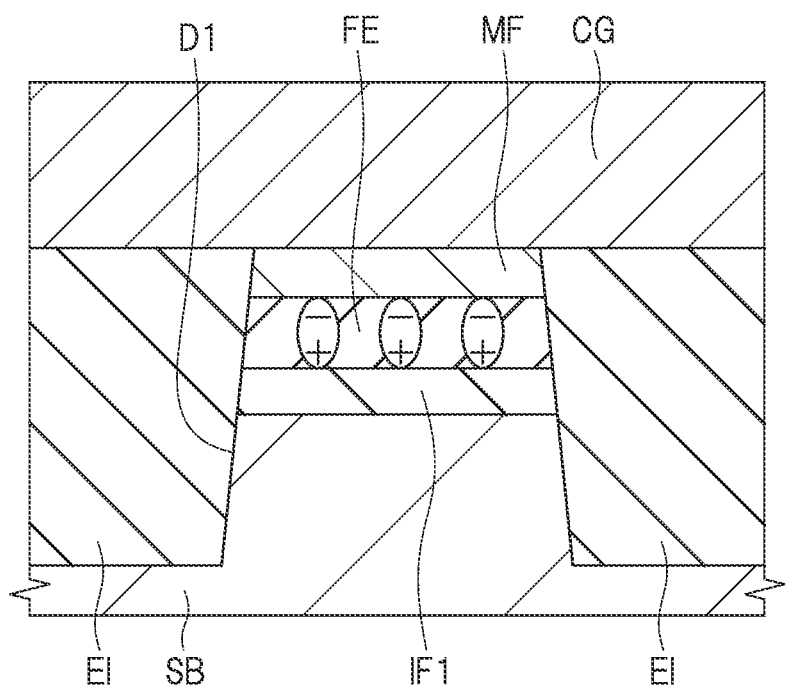
FIG. 4 is a cross-sectional view taken along a line A-A of FIG. 3.
Figure 5:
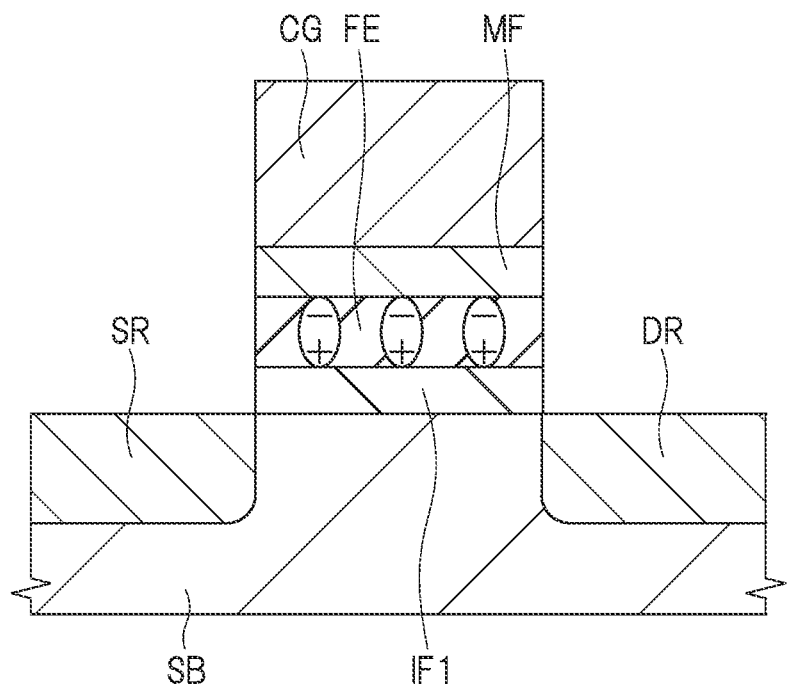
FIG. 5 is a cross-sectional view taken along a line B-B of FIG. 3.

Hereinafter, a semiconductor device having a ferroelectric memory which is a nonvolatile memory of the present embodiment will be described with reference to FIGS. 1 to 5. FIG. 1 is a schematic view showing a layout configuration example of a semiconductor chip on which the semiconductor device of the present embodiment is mounted. FIG. 2 is a perspective view showing the semiconductor device of the present embodiment. FIG. 3 is a plan view showing the semiconductor device of the present embodiment. FIG. 4 is a cross-sectional view taken along a line A-A of FIG. 3. FIG. 5 is a cross-sectional view taken along a line 3-3 of FIG. 3. In other words, FIG. 4 is a cross-sectional view taken along a gate width direction of a memory cell, and FIG. 5 is a cross-sectional view taken along a gate length direction of the memory cell.

First, the layout configuration of the semiconductor device (semiconductor chip) in which a system including the nonvolatile memory is formed will be described. In FIG. 1, the semiconductor chip CHP has a CPU (Central Processing Unit) circuit C1, a RAM (Random Access Memory) circuit C2, and an analog circuit C3. In addition, the semiconductor chip CHP has an EEPROM (Electrically Erasable Programmable Read Only Memory) circuit C4, a ferroelectric memory C5, and an I/O (Input/Output) circuit C6. The semiconductor chip CHP constitutes the semiconductor device.

The CPU circuit C1 is also referred to as a central processing device, reads and decodes instructions from a storage device, and performs a wide variety of calculations and controls based on the decoded instructions.

The RAM circuit C2 is a memory capable of randomly reading stored information, that is, capable of reading the stored information at any time, is a memory capable of writing new stored information, and is also referred to as a memory capable of reading and writing at any time. An SRAM (Static RAM) using a static circuit is used as the RAM.

The analog circuit C3 is a circuit that handles voltage and current signals, that is, analog signals that change continuously over a period of time, and is constituted by, for example, an amplification circuit, a conversion circuit, a modulation circuit, an oscillation circuit, a power supply circuit, or the like.

The EEPROM circuit C4 and the ferroelectric memory C5 are a type of nonvolatile memory in which the stored information can be electrically rewritten in a write operation and an erase operation, and are also referred to as an electrically erasable and programmable read-only memory. The memory cell of the EEPROM circuit C4 is constituted by, for example, a MONOS (Metal Oxide Nitride Oxide Semiconductor) type transistor or the like for storage (memory). Various data that are frequently rewritten are stored in the EEPROM circuit C4. The EEPROM circuit C4 or the ferroelectric memory C5 has a memory cell array in which a plurality of nonvolatile memory cells are arranged in a matrix-like manner, and other components such as an address buffer, a row decoder, a column decoder, a verifying sense amplifier circuit, a sense amplifier circuit, a write circuit, or the like.

The I/O circuit C6 is an input/output circuit, and is a circuit for outputting data from the semiconductor chip CHP to equipment connected outside the semiconductor chip CHP, for inputting data from the equipment connected outside the semiconductor chip CHP to the semiconductor chip, or the like.

The semiconductor device of the present embodiment has a memory cell region and a logic circuit region. The memory cell array in which the plurality of nonvolatile memory cells are arranged in a matrix-like manner is formed in the memory cell region. The CPU circuit C1, the RAM circuit C2, the analog circuit C3, the I/O circuit C6, the address buffer, the row decoder, the column decoder, the verifying sense amplifier circuit, the sense amplifier circuit or the write circuit of the EEPROM circuit C4 or the ferroelectric memory C5 and the like are formed in the logic circuit region.

<Structure of Semiconductor Device>

FIGS. 2 to 5 show the memory cell of the ferroelectric memory of the present embodiment. This memory cell is formed on the ferroelectric memory C5 of FIG. 1.

In the present embodiment, a case where an n-channel type MISFET (Metal Insulator Semiconductor Field Effect Transistor, MIS type field effect transistor) is formed as a transistor constituting the memory cell in the memory cell region will be described. Note that the conductivity type can be made to be opposite to form the ferroelectric memory constituted by a p-channel type MISFET.

The semiconductor device of the present embodiment has the semiconductor substrate SB constituted by, for example, a p type single crystal silicon (Si) or the like having a specific resistance of about 1 to 10 Ωcm. The semiconductor substrate SB has an upper surface (main surface) and a lower surface (back surface) on an opposite side of the upper surface, and the memory cell is formed on the upper surface side of the semiconductor substrate SB. A plurality of trenches D1 are formed in the upper surface of the semiconductor substrate SB, and the element isolation region EI constituted by an insulating film defining the active region is formed in each of the trenches D1. The element isolation region EI is constituted by an insulator such as silicon oxide, and can be formed by, for example, an STI (Shallow Agree Isolation) method, LOCOS (Local Oxidization of Silicon) method, or the like. Here, the element isolation region EI is formed by the STI method.

The memory cell of the ferroelectric memory has a stacked film constituted by the insulating film IF1, the ferroelectric film FE and the metal film MF formed in this order on the active region on the semiconductor substrate SB. In addition, the memory cell of the ferroelectric memory is constituted by the ferroelectric film FE, the metal film MF, the control gate electrode CG formed on the stacked film, and a pair of source and drain regions SR and DR formed in the upper surface of the active region of the semiconductor substrate SB next to the control gate electrode CG. The memory cell of the ferroelectric memory a nonvolatile storage element. A p type well (not shown) in which p type impurities (such as B (boron)) are introduced at a relatively low concentration is formed in the upper surface of the semiconductor substrate SB below the memory cell. The control gate electrode CG is constituted by, for example, a polysilicon film.

The source and drain regions SR and DR are each an n type semiconductor region in which n type impurities (such as As (arsenic) or P (phosphorus) or both) are introduced at a predetermined concentration. Note that, although not shown, the source and drain regions SR and DR may have an extension region EX1 which is an n-type semiconductor region introduced into the upper surface of the semiconductor substrate SB at a lower concentration than the above-described predetermined concentration. The source and drain regions SR and DR are each formed so as to have a predetermined depth extending from the upper surface of the semiconductor substrate SB to an intermediate depth of the semiconductor substrate SB. A depth of the p type well is deeper than the depth of each of the source and drain regions SR and DR.

The depth referred to in the present application is a distance in a direction perpendicular to the upper surface of the semiconductor substrate SB (height direction, depth direction, perpendicular direction, vertical direction) in a case of the semiconductor region formed on the upper surface of the semiconductor substrate SB. In other words, the depth here refers to the distance from the upper surface of the semiconductor substrate SB to the lower surface located on a lowermost side of the semiconductor region (back surface side of the semiconductor substrate SB).

In plan view, the control gate electrode CG extends in the Y direction and over the plurality of the element isolation regions EI and over the active region between the element isolation regions EI. In other words, the control gate electrode CG is formed so as to extend just above and between the two element isolation regions EI that sandwich the active region in the Y direction. The source and drain regions SR and DR are formed in the active region so as to sandwich the control gate electrode CG in the X direction. A region (channel region) in which both the source and drain regions SR and DR are not formed is present in the upper surface of the semiconductor substrate SB just below the control gate electrode CG. The X direction and the Y direction are directions orthogonal to each other, and are directions along the upper surface of the semiconductor substrate SB. The X direction is a direction of a channel length of the MISFET constituting the memory cell, and the Y direction is a direction of a channel width of the MISFET.

Here, as one feature of the ferroelectric memory of the present embodiment, the ferroelectric film FE is not formed just above the element isolation region EI. Specifically, the ferroelectric film FE is only formed just above the semiconductor substrate SB in the active region between the two element isolation regions EI aligned in the Y direction. For this reason, an upper surface of the element isolation region EI is exposed from the ferroelectric film FE. Namely, the upper surface of the element isolation region EI just below the control gate electrode CG is exposed from the ferroelectric film FE. Here, the control gate electrode CG and the upper surface of the element isolation region EI are in contact with each other. In addition, both ends of the ferroelectric film FE are each in contact with a side surface of the element isolation region EI.

Although not shown, an interlayer insulating film covering the memory cell is formed on the semiconductor substrate SB. A plug (contact plug) is connected to an upper surface of each of the control gate electrode CG and source and drain regions SR and DR via a silicide layer. The plug is a metal film for connection (conductive connection) penetrating the interlayer insulating film. The plug is connected to a wiring on the interlayer insulating film.

The ferroelectric film FE is an insulating film constituted by a ferroelectric material which is a material in which dielectric polarization occurs when an electrical field (electric field) is applied, and in which polarization does not become zero even when the electrical field (electric field) is removed. Namely, unlike a paraelectric material, the polarization remains in the ferroelectric film FE even when no electric field is applied. The ferroelectric material is a material in which electric dipoles are aligned even when there is no external electrical field, and in which a direction of the dipoles can be changed by the electrical field.

It is known that properties of the ferroelectric film appear when a crystalline layer of this high-k film is a rectangular crystal. In the ferroelectric memory, the crystal constituting the ferroelectric film FE is formed with a rectangular crystal in order to increase residual polarization of the ferroelectric film, enhance performance as the ferroelectric material, and reduce a driving power of the ferroelectric memory.

The ferroelectric film FE is a film constituted by, for example, $HfO_2$ (hafnia). In other words, the ferroelectric film FE is a hafnium oxide ($Hf_xO_y$) film.

It is desirable for the ferroelectric film FE to have a thin film thickness for purposes such as low voltage operation of the memory cell. It is desirable for the film thickness of the ferroelectric film FE to be, for example, less than or equal to 10 nm.

The metal film MF is a conductive film constituted by, for example, a TiN (titanium nitride) film or the like.

<Operation of Semiconductor Device>

Next, an operation example of the nonvolatile memory will be described. In the present embodiment, "write" is defined as a state in which the polarization of the ferroelectric film FE is upward and a threshold voltage of the transistor constituting the memory cell is relatively high. "Erase" is defined as a state in which the polarization of the ferroelectric film FE is downward and the threshold voltage of the transistor constituting the memory cell is relatively low.

In the memory cell of the present embodiment, write is performed by applying a negative voltage to the control gate electrode CG and polarizing the ferroelectric film FE of the selected memory cell upward. As a result, the threshold voltage of the transistor constituting the memory cell increases. Namely, the memory cell enters the write state.

In the memory cell of the present embodiment, erase is performed by applying a positive voltage to the control gate electrode CG and polarizing the ferroelectric film FE of the selected memory cell downward. As a result, the threshold voltage of the transistor constituting the memory cell decreases. Namely, the memory cell enters the erase state. FIG. 5 shows the polarization of the ferroelectric film FE at the time of erase. Namely, in the ferroelectric film FE, the portion on the semiconductor substrate SB side is positively charged, and the portion on the control gate electrode CG side is negatively charged.

At the time of read, the voltage applied to the control gate electrode CG is set to a value between the threshold voltage of the above-described transistor in the write state and the threshold voltage or the above-described transistor in the erase state to discriminate between the write state and the erase state.

<Effects of Present Embodiment>

Next, effects of the semiconductor device of the present embodiment will be described. As described above with reference to FIGS. 33 to 35, in the ferroelectric memory in which the ferroelectric film FE is formed over the element isolation region EI, it would be difficult to control the polarization state on the element isolation region EI, and there is room for improvement regarding a decrease in performance of the ferroelectric memory caused by the above.

In the present embodiment, the ferroelectric film FE is not formed just above the element isolation region EI, and the ferroelectric film FE is formed only on the active region. This prevents an occurrence of a situation in which the polarization states differ between the ferroelectric film FE on the element isolation region EI and the ferroelectric film FE on the active region. Therefore, it is possible to prevent deterioration of retention characteristics of the memory cell and an increase in erroneous write and erroneous erase. As a result, performance of the semiconductor device can be enhanced.

<Manufacturing Process of Semiconductor Device>

Hereinafter, a manufacturing method of the semiconductor device of the present embodiment will be described with reference to FIGS. 6 to 9 and 2 to 5. FIGS. 6 to 9 are cross-sectional views of the semiconductor device of the present embodiment in a formation process. FIGS. 6 to 9 are cross-sectional views showing the same cross section taken along the line A-A of FIG. 3, like FIG. 4. In other words, FIGS. 6 to 9 are cross-sectional views taken along the gate width direction of the memory cell.

Figure 6:
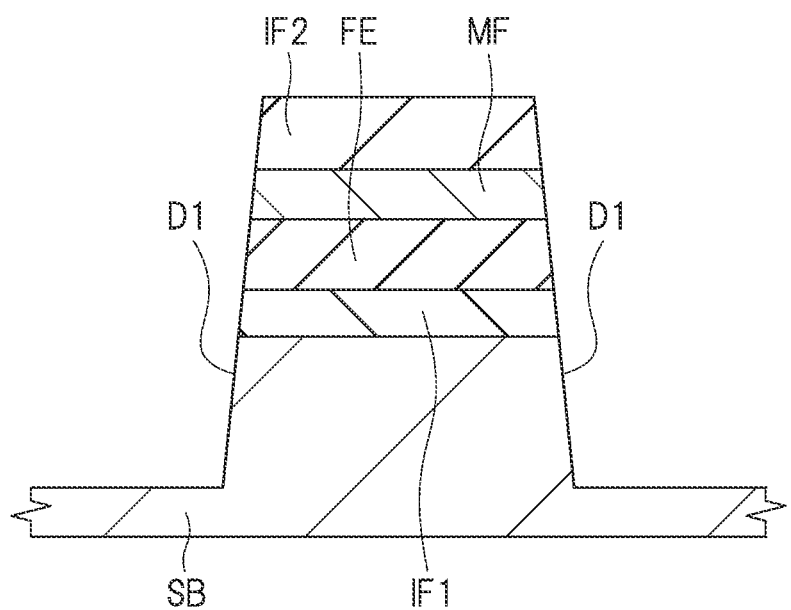
FIG. 6 is a cross-sectional view of the semiconductor device according to the first embodiment of the present invention in a manufacturing process.

First, as shown in FIG. 6, the semiconductor substrate SB is prepared. The semiconductor substrate SB is constituted by, for example, a p type single crystal silicon or the like having a specific resistance of about 1 to 10 Ωcm. Subsequently although not shown, impurities are introduced into the upper surface of the semiconductor substrate SB by using an ion implantation method to form a p type well which is a p type semiconductor region extending from the upper surface of the semiconductor substrate SB to the intermediate depth of the semiconductor substrate SB. The p type well is formed by implanting p type impurities (such as B (boron)). Subsequently, the insulating film IF1, the ferroelectric film FE, the metal film MF and an insulating film IF2 are formed on the semiconductor substrate SB. The insulating film IF1 is, for example, a silicon oxide film, and can be formed by, for example, a thermal oxidation method. The ferroelectric film FE is, for example, a $HfO_2$ (hafnia) film, and can be formed by, for example, a CVD (Chemical Vapor Deposition) method, a PVD (Physical Vapor Deposition) method, or the like. In addition, the ferroelectric film FE can be formed by an ALD (Atomic Layer Deposition) method. The metal film MF is, for example, a TiN (titanium nitride) film, and can be formed by using, for example, the CVD method or a sputtering method. The insulating film IF2 is constituted by, for example, a silicon nitride film, and can be formed by, for example, the CVD method.

Subsequently, the plurality of trenches (isolation trenches) D1 extending from an upper surface of the stacked film constituted by the insulating film IF1, the ferroelectric film FE, the metal film MF and the insulating film IF2 to the intermediate depth of the semiconductor substrate SB are formed by using a photolithography technique and a dry etching method. In this etching process, the plurality of trenches D1 extending from the upper surface of the stacked film to the intermediate depth of the semiconductor substrate SB can be formed by performing etching using a photo resist film (not shown) as a mask. In addition, the plurality of trenches D1 that reach the intermediate depth of the semiconductor substrate SB may be formed by patterning the insulating film IF2 using the photo resist film (not shown) as a mask, and performing etching using the insulating film IF2 as a hard mask. In other words, the stacked film constituted by the insulating film IF1, the ferroelectric film FE, the metal film MF and the insulating film IF2 is patterned, and the plurality of trenches D1 are formed in the upper surface of the semiconductor substrate SB exposed by the patterning.

Figure 7:
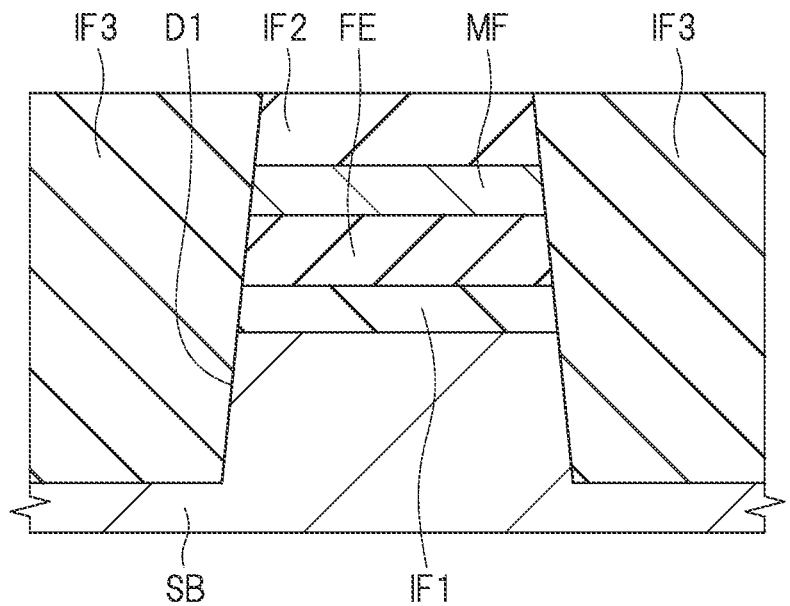
FIG. 7 is a cross-sectional view of the semiconductor device in the manufacturing process continued from FIG. 6.

Next, as shown in FIG. 7, an insulating film IF3 (such as a silicon oxide film) embedded in each of the plurality of trenches D1 is formed by using, for example, the CVD method. Then, the insulating film IF3 outside each of the plurality of trenches D1 is removed. In other words, an upper surface of the insulating film IF2 is exposed from the insulating film IF3 by performing a polishing process using, for example, a CMP (Chemical Mechanical Polishing) method.

Figure 8:
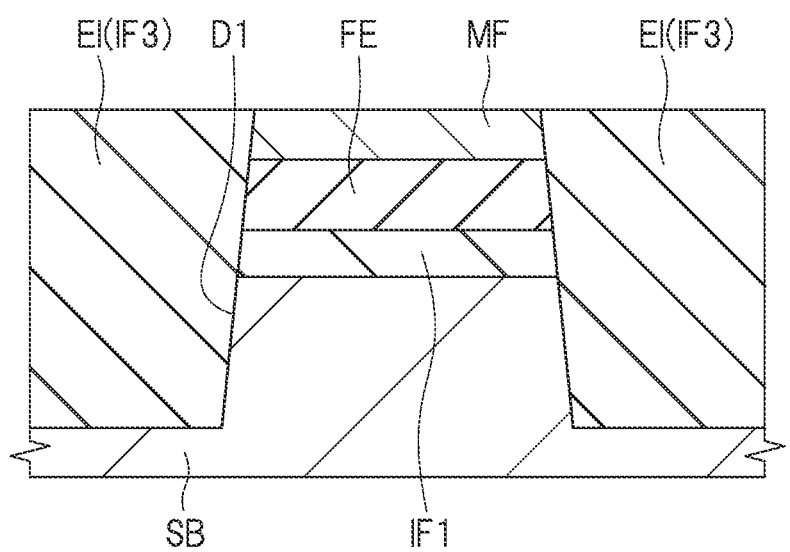
FIG. 8 is a cross-sectional view of the semiconductor device in the manufacturing process continued from FIG. 7.

Next, as shown in FIG. 8, the insulating film IF2 is removed to expose an upper surface of the metal film MF and retract an upper surface of the insulating film IF3 by performing etch back. As a result, the element isolation region EI constituted by the insulating film IF3 remaining in each of the trenches D1 is formed. The element isolation region EI is mainly constituted by an insulator such as silicon oxide, and has, for example, an STI structure.

Figure 9:
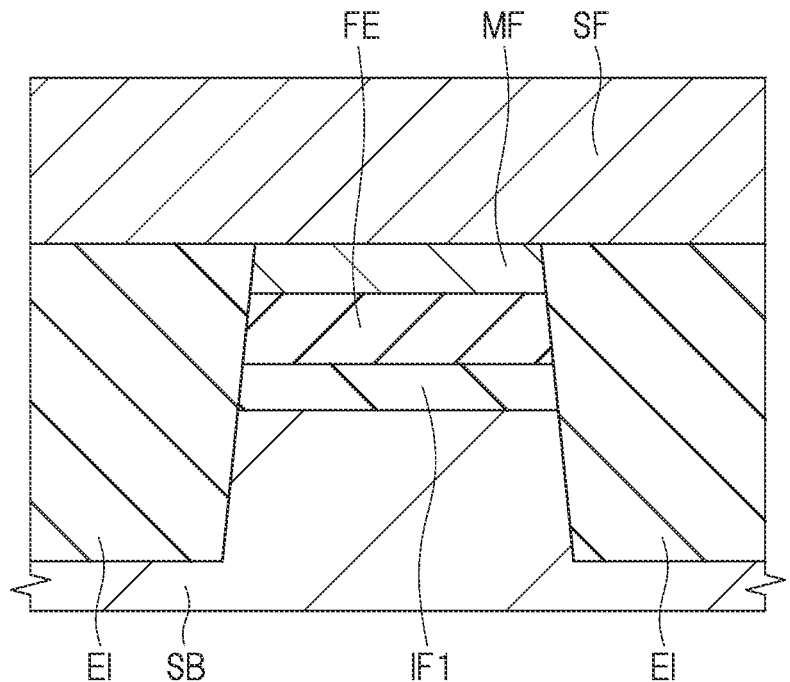
FIG. 9 is a cross-sectional view of the semiconductor device in the manufacturing process continued from FIG. 8.

Next, as shown in FIG. 9, a polysilicon film SF is formed on the semiconductor substrate SB (on the element isolation region EI and on the metal film MF). The polysilicon film SF is formed so as to cover the upper surface of each of the element isolation region EI and metal film MF. The structure shown in FIG. 9 is obtained in this manner.

Next, the control gate electrode CG is formed by patterning the polysilicon film SF, and the source and drain regions SR and DR are formed in the upper surface of the semiconductor substrate SB in the active region to form the memory cell of the ferroelectric memory shown in FIGS. 2 to 5.

Namely, the polysilicon film SF, the metal film MF, the ferroelectric film FE and the insulating film IF1 are processed by using the photolithography technique and the dry etching method, and the upper surface of the semiconductor substrate SB and the upper surface of the element isolation region EI are exposed in this manner. The control gate electrode CG constituted by the polysilicon film SF is formed by this patterning process. Namely, a stacked body constituted by the insulating film IF1, the ferroelectric film FE, the metal film MF and the control gate electrode CG stacked in this order on the upper surface of the semiconductor substrate SB is formed. Subsequently, ion implantation is performed on the upper surface of the semiconductor substrate SB by using the control gate electrode CG as a mask (ion implantation blocking mask). As a result, the pair of source and drain regions SR and DR which are n type semiconductor regions is formed in the upper surface of the semiconductor substrate SB in the active region. The source and drain regions SR and DR are each formed so as to have a predetermined depth from the upper surface of the semiconductor substrate SB, and this depth is shallower than the depth of each of the element isolation region EI and p type well.

As a result, the memory cell of the ferroelectric memory constituted by the MISFET (MIS type field effect transistor) including the ferroelectric film FE, the metal film MF, the control gate electrode CG and the source and drain regions SR and DR is formed. Then, although not shown, the interlayer insulating film covering the ferroelectric memory, the plug penetrating the interlayer insulating film, and the wiring on the plug are formed to substantially complete the semiconductor device of the present embodiment.

<Effects of Manufacturing Method of Semiconductor Device>

Next, effects of the manufacturing method of the semiconductor device of the present embodiment will be described.

In the present embodiment, as described with reference to FIGS. 6 to 8, the ferroelectric film FE is formed, and then the plurality of trenches D1 and the element isolation region EI separating the ferroelectric film FE are formed. In this manner, the ferroelectric film FE is not formed on the element isolation region EI.

As described above regarding the effects of the semiconductor device of the present embodiment, the ferroelectric film FE is not formed just above the element isolation region EI, and the ferroelectric film FE is formed only on the active region. This prevents an occurrence of a situation in which the polarization states differ between the ferroelectric film FE on the element isolation region EI and the ferroelectric film FE on the active region. Therefore, it is possible to prevent deterioration of retention characteristics of the memory cell and an increase in erroneous write and erroneous erase. As a result, performance of the semiconductor device can be enhanced.

In addition, in the present embodiment, the ferroelectric film FE and the metal film MF are each partially removed at the same me as the formation of the trenches D1, whereby there is no need to prepare an additional photolithography mask compared to the case of manufacturing the memory cell of the comparative example shown in FIG. 33. Therefore, it is possible to prevent a manufacturing process of the semiconductor device from becoming complicated, and prevent an increase in the manufacturing cost.

In addition, a boundary between the element isolation region EI and the ferroelectric film FE is determined by self-aligning, whereby there is no need to consider exposure deviation in photolithography.

Here, forming the metal film MF and then forming the element isolation region EI has been described. In this case, the metal film MF is not formed on the element isolation region EI. However, the metal film may be formed on the element isolation region EI as in the second modification example of the present embodiment described below. In this case, the insulating film IF2 is formed so as to be in contact with an upper surface of the ferroelectric film FE in the process described with reference to FIG. 6, and the upper surface of the ferroelectric film FE is exposed in the etch back process described with reference to FIG. 8. Next, the metal film MF and the polysilicon film SF are formed in this order on the ferroelectric film FE and the element isolation region EI in the process described with reference to FIG. 9.

First Modification Example

Figure 10:
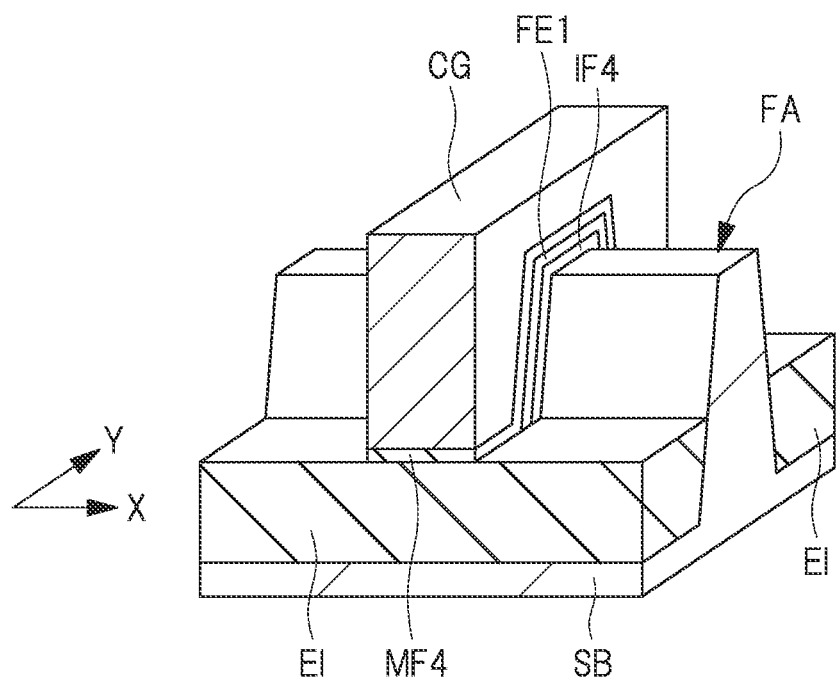
FIG. 10 is a perspective view showing the semiconductor device according to a first modification example of the first embodiment of the present invention.

The present embodiment is also applicable to a ferroelectric memory having a fin structure. FIG. 10 is a perspective view of the memory cell of the ferroelectric memory which is the semiconductor device of the present modification example.

As shown in FIG. 10, the memory cell region has a plurality of fins FA extending in the X direction and arranged so as to be equally spaced in the Y direction. Note that FIG. 10 shows only one fin FA. The fin FA is, for example, a rectangular protruding portion (convex portion) selectively protruding from the upper surface of the semiconductor substrate SB, and has a plate-like shape. A lower end portion of the fin FA is surrounded by the element isolation region EI covering the upper surface of the semiconductor substrate SB. In other words, the fin FA protrudes more upward than the upper surface of the element isolation region EI. The fin FA is a portion of the semiconductor substrate SB, and is the active region of the semiconductor substrate SB. In plan view, the element isolation region EI is embedded between the adjacent fins FA, and the surroundings of the fin FA is surrounded by the element isolation region EI.

The plurality of control gate electrodes CG extending in the Y direction are arranged on the plurality of fins FA. Each of the control gate electrodes CG is formed so as to extend over the plurality of fins FA. In the region covered by the control gate electrode CG, an insulating film IF4, a ferroelectric film FE1 and a metal film MF4 are formed in this order on upper and side surfaces of the fin FA. The insulating film IF4 and the ferroelectric film FE1 expose the upper surface of the element isolation region EI, and the metal film MF4 covers the upper surface of the element isolation region EI. Namely, the metal film MF4 is formed below the control gate electrode CG so as to extend over the plurality of fins FA, like the control gate electrode CG. Therefore, the metal film MF4 is interposed between the control gate electrode CG and the upper surface of the element isolation region EI.

Although not shown, the source and drain regions which are n type semiconductor regions are formed in the fin FA so as to sandwich the control gate electrode CG in plan view. The source and drain regions extending from the upper and side surfaces of the fin FA to a predetermined depth are each formed in the fin FA (in the semiconductor substrate SB). In addition, the source and drain regions may be formed in an epitaxial layer (semiconductor layer) formed on each of the upper and side surfaces of the fin FA exposed from the control gate electrode CG by an epitaxial growth method. Note that, although not shown, a p type well is formed in the fin FA.

In a fin type FET (FINFET) including the control gate electrode CG and the source and drain regions, a channel is formed in the side surface of the fin FA in addition to the upper surface of the fin FA. For this reason, the FINFET has a small area in plan view but has a large channel width, which is advantageous for miniaturizing the semiconductor device.

The fin FA is, for example, a rectangular protruding portion protruding from the upper surface of the semiconductor substrate SB in a direction perpendicular to the upper surface (upward). The fin FA is not necessarily rectangular, and may be a rectangular shape with its corners rounded in a cross-sectional view in a short-side direction. In addition, the side surface of the fin FA may be perpendicular to the upper surface of the semiconductor substrate SB, but also may have an inclination angle close to perpendicular. In other words, the cross-sectional shape of the fin FA is a rectangle or a trapezoid.

Next, the manufacturing method of the semiconductor device of the present modification example will be described with reference to FIGS. 11 to 16 and 10. FIGS. 11 to 16 are cross-sectional views of the semiconductor device of the present modification example in a formation process. FIGS. 11 to 16 are cross-sectional views taken along the gate width direction of the memory cell, that is, taken along a shorthand direction of the fin (extension direction of the control gate electrode).

Figure 11:
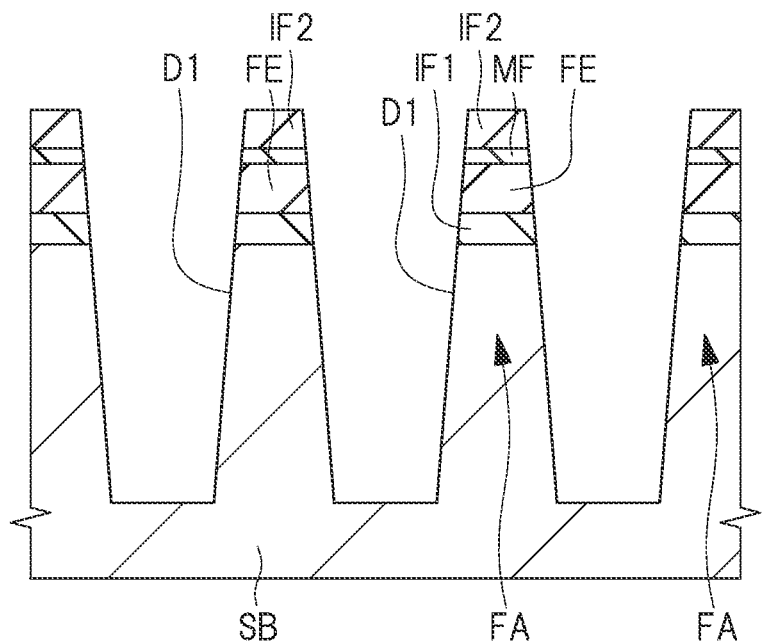
FIG. 11 is a cross-sectional view of the semiconductor device according to the first modification example of the first embodiment of the present invention in a manufacturing process.

First, as shown in FIG. 11, the insulating film IF1, the ferroelectric film FE, the metal film MF and the insulating film IF2 are formed in this order on the semiconductor substrate SB, and then the plurality of trenches D1 are formed by performing the same process described above with reference to FIG. 6. As a result, the fin FA extending in the X direction is formed between the two trenches D1. Here, the plurality of fins FA are formed aligned in the Y direction.

Figure 12:
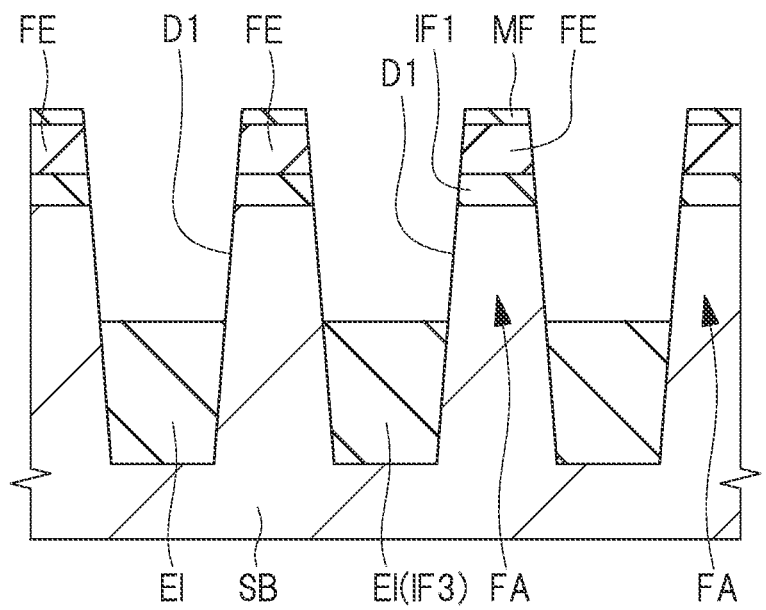
FIG. 12 is a cross-sectional view of the semiconductor device in the manufacturing process continued from FIG. 11.

Next, as shown in FIG. 12, the insulating film IF3 embedded in each of the trenches D1 is formed by performing the same process as described above with reference to FIG. 7. Subsequently, the insulating film IF2 is removed by performing etch back, and the upper surface of the insulating film IF3 is retracted to a position lower than the upper surface of the fin FA by further performing etch back. As a result, the element isolation region EI constituted by the insulating film IF3 is formed. Namely, the element isolation region EI formed here has an upper surface on which a portion including an upper end of the fin FA is exposed.

Figure 13:
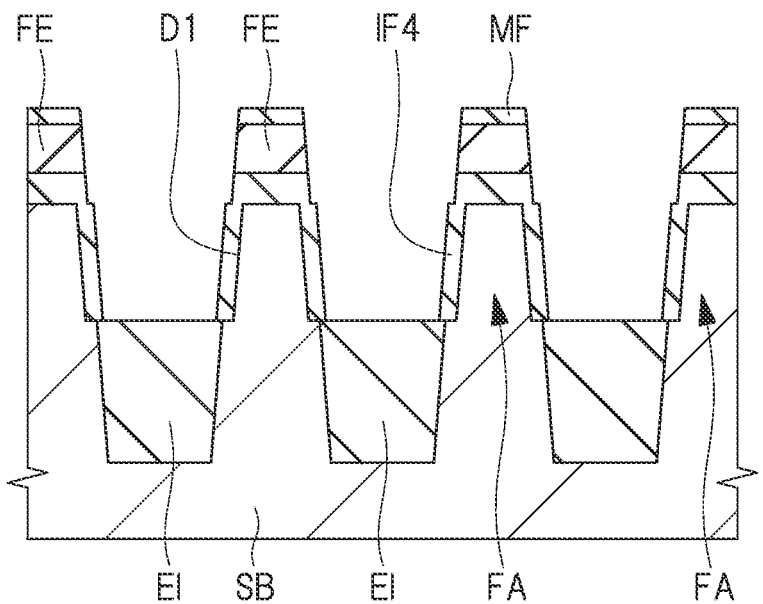
FIG. 13 is a cross-sectional view of the semiconductor device in the manufacturing process continued from FIG. 12.

Next, as shown in FIG. 13, the insulating film IF4 which is silicon oxide film is formed on the side surface of the fin FA exposed on the element isolation region EI by performing an oxidation process. Here, the silicon oxide film formed on the side surface of the fin FA is integrated with the insulating IF1 in contact with the upper surface of the fin FA, whereby the silicon oxide film and the insulating film IF1 are collectively referred to as the insulating film IF4.

Figure 14:
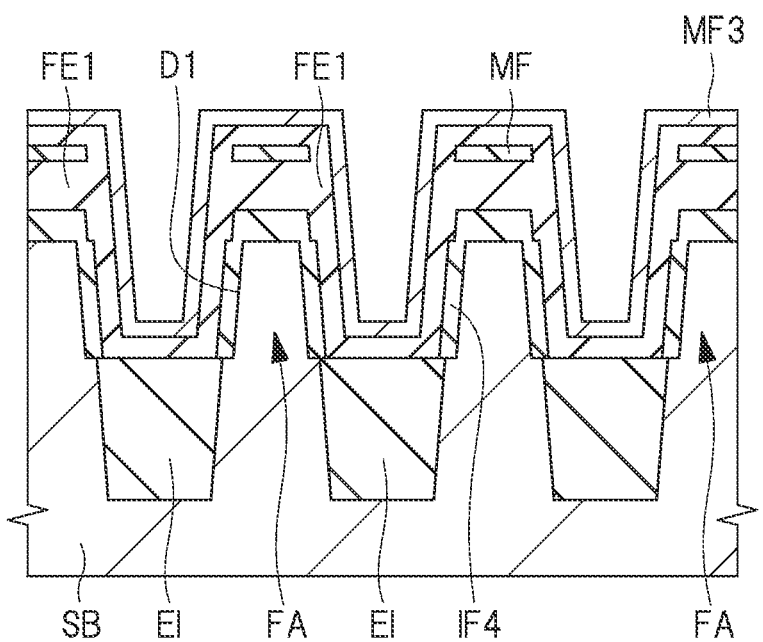
FIG. 14 is a cross-sectional view of the semiconductor device in the manufacturing process continued from FIG. 13.

Next, as shown in FIG. 14, the ferroelectric film and a metal film MF3 are stacked in this order on the semiconductor substrate SB. The ferroelectric film can be formed by, for example, the CVD method or the like, and the metal film MF3 can be formed by, for example, the sputtering method. The ferroelectric film is integrated with the ferroelectric film FE just above the fin FA, whereby the ferroelectric film and the ferroelectric film FE just above the fin FA are collectively referred to as the ferroelectric film FE1. The stacked film constituted by the ferroelectric film FE1 and the metal film MF3 are not completely embedded between the adjacent fins FA. Each of the ferroelectric film FE1 and metal film MF3 is constituted by, for example, the same material as the ferroelectric film FE and the metal film MF.

Figure 15:
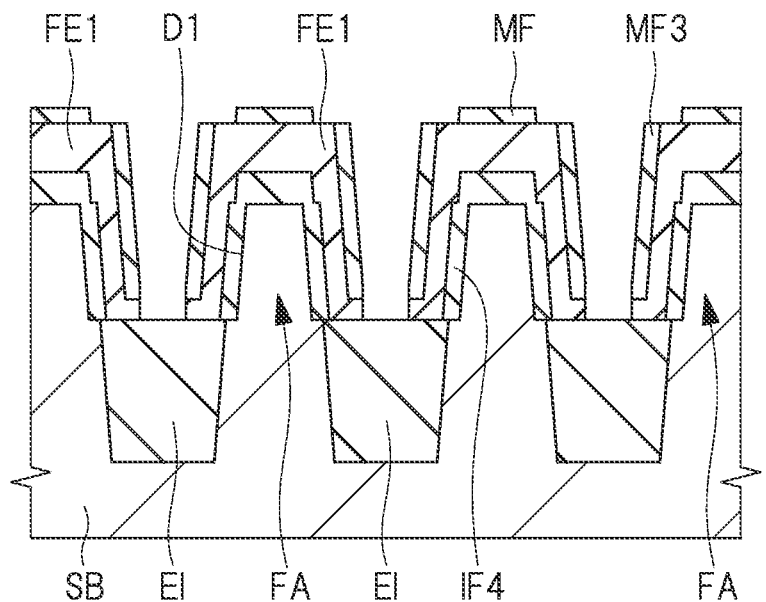
FIG. 15 is a cross-sectional view of the semiconductor device in the manufacturing process continued from FIG. 14.

Next, as shown in FIG. 15, the stacked film constituted by the ferroelectric film FE1 and the metal film MF3 is etched back to expose the upper surface of the element isolation region EI between the adjacent fins FA. In other words, the ferroelectric films FE1 covering the surface of each of the fins FA are separated from each other.

Figure 16:
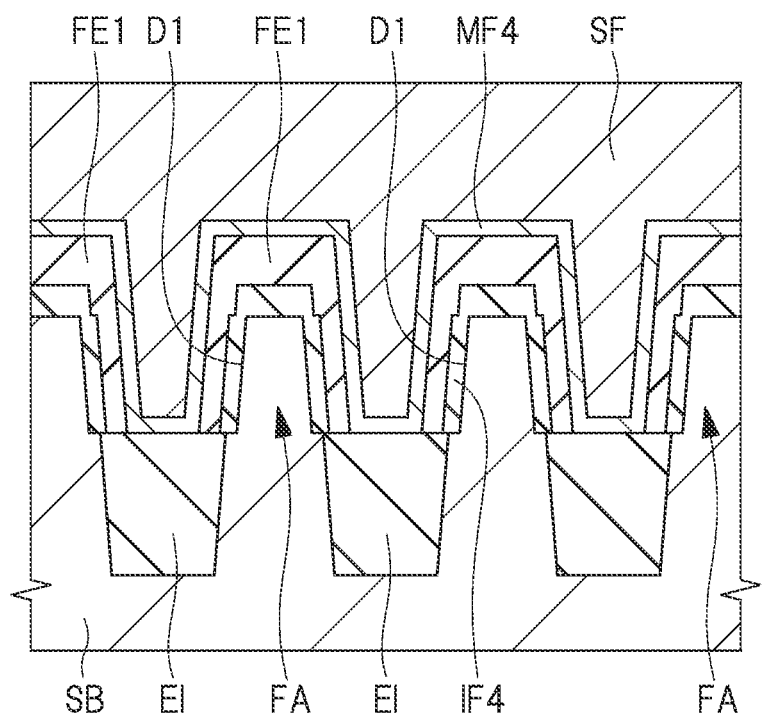
FIG. 16 is a cross-sectional view of the semiconductor device in the manufacturing process continued from FIG. 15.

Next, as shown in FIG. 16, the metal film MF4 and the polysilicon film SF are stacked in this order. As a result, a portion between the adjacent fins FA are embedded by the insulating film IF4, the ferroelectric film FE1, the metal film MF4 and the polysilicon film SF. In other words, the polysilicon film SF is formed so as to cover the upper and side surfaces of the fin FA. Here, the metal films MF and MF3 may be removed before the metal film MF4 is formed. FIG. 10 shows a case where the metal film MF and MF3 are remaining and are integrated with the metal film MF4.

Next, as shown in FIG. 10, a stacked film constituted by the polysilicon film SF, the meal film MF4, the ferroelectric film FE1 and the insulating film IF4 is patterned by using the photolithography technique and the dry etching method. In this manner, a pattern of the stacked film extending in the Y direction is formed, and the upper surface of the element isolation region EI is exposed from the pattern. As a result, the control gate electrode CG constituted by the polysilicon film SF is formed.

Subsequently, although not shown, n type impurities are introduced into the fins FA exposed from the pattern and sandwiching the control gate electrode CG in the X direction in plan view to form the source and drain regions. As a result, the memory cell of the ferroelectric memory comprising the control gate electrode CG, the metal film MF4, the ferroelectric film FE1 and the source and drain regions is formed. Note that the source and drain regions may form the epitaxial layer on the surface of the fin FA exposed from the pattern by the epitaxial growth method, and may be formed by introducing n type impurities into the epitaxial layer.

As described above, even in the memory cell of the ferroelectric memory which is a FINFET, the above-described effects of the present embodiment can be obtained by not forming the ferroelectric film FE1 on the element isolation region EI.

Second Modification Example

Figure 17:
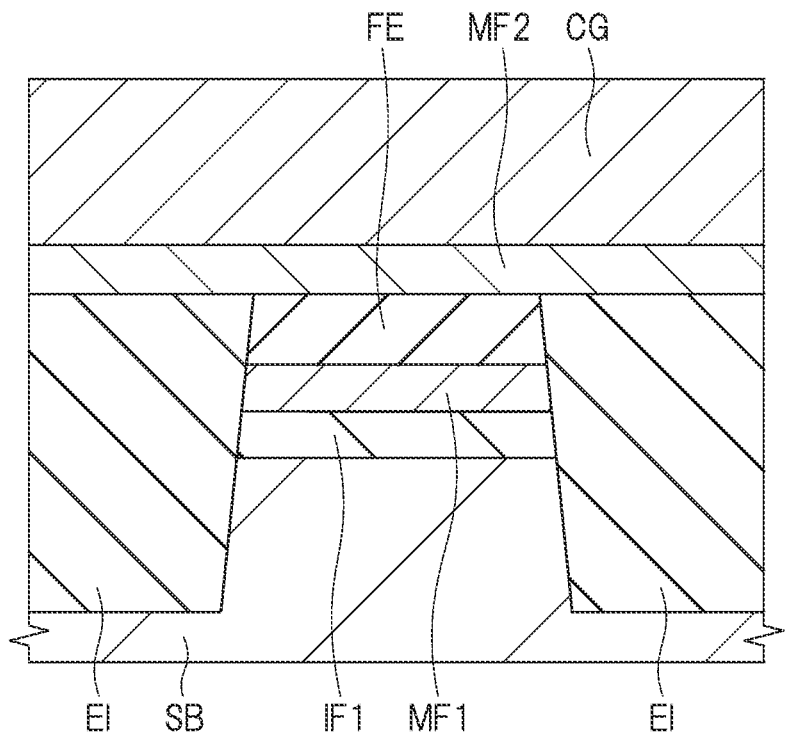
FIG. 17 is a cross-sectional view showing the semiconductor device according to a second modification example of the first embodiment of the present invention.
Figure 18:
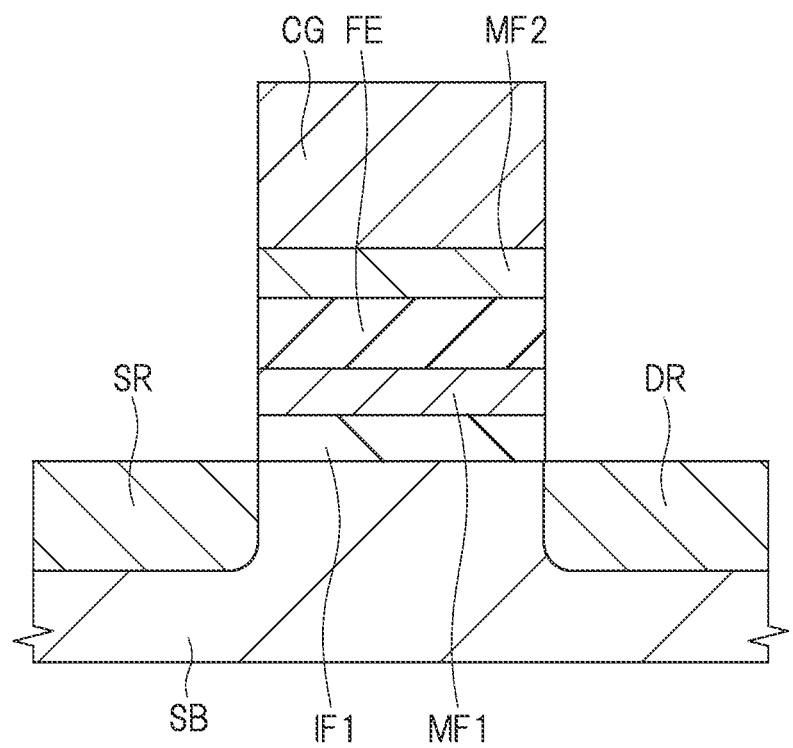
FIG. 18 is a cross-sectional view showing the semiconductor device according to the second modification example of the first embodiment of the present invention.

The present embodiment is also applicable to a ferroelectric memory having a MFMIS structure in which an insulating film (I), a lower metal film (M), a ferroelectric film (F) and an upper metal film (M) are stacked in this order on a silicon substrate (S). FIGS. 17 and 18 are cross-sectional views of the memory cell of the ferroelectric memory which is the semiconductor device of the present modification example. Like FIG. 4, FIG. 17 is a cross-sectional view taken along the gate width direction of the memory cell. Like FIG. 5, FIG. 18 is a cross-sectional view taken along the gate length direction of the memory cell.

As shown in FIGS. 17 and 18, the plurality of trenches are formed in the upper surface of the semiconductor substrate SB, and the element isolation region EI is formed in each of the trenches. The insulating film IF1, a metal film MF1, the ferroelectric film FE, a metal film MF2 and the control gate electrode CG are formed between the adjacent element isolation regions EI, that is, on the upper surface of the semiconductor substrate SB in the active region. Here, the insulating film IF1, the metal film NF1 and the ferroelectric film FE are formed only between the adjacent element isolation regions EI, and the metal film MF2 and the control gate electrode CG on the ferroelectric film FE and on the element isolation region EI extend in the X direction. Other structures of the source and drain regions SR and DR are the same as those of the memory described with reference to FIGS. 2 to 5. The memory cell of the ferroelectric memory is constituted by the metal film MF1, the ferroelectric film FE, the metal film MF2, the control gate electrode CG, and the source and drain regions SR and DR.

Figure 19:
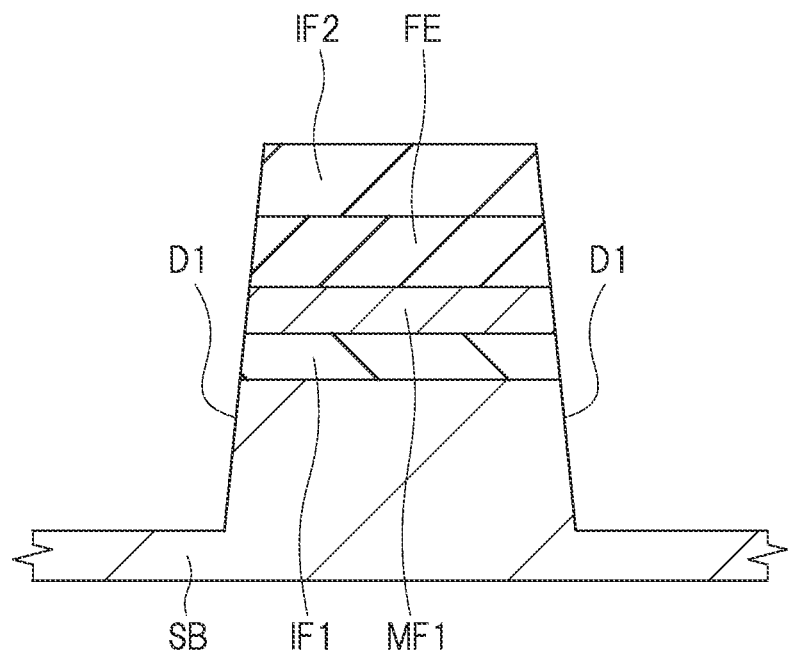
FIG. 19 is a cross-sectional view of the semiconductor device according to the second modification example of the first embodiment of the present invention in a manufacturing process.
Figure 20:
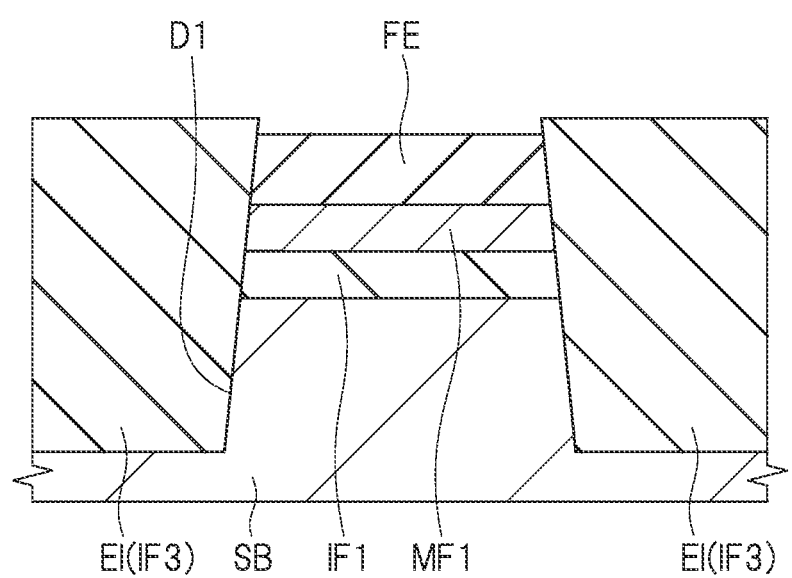
FIG. 20 is a cross-sectional view of the semiconductor device in the manufacturing process continued from FIG. 19.

Next, the manufacturing method of the semiconductor device of the present modification example will be described with reference to FIGS. 19 and 20. FIGS. 19 and 20 are cross-sectional views taken at a portion corresponding to FIG. 17, that is, cross-sectional views taken along the gate width direction of the memory cell to be formed.

First, as shown in FIG. 19, the semiconductor substrate SB is prepared. Subsequently, although not shown, impurities are introduced into the upper surface of the semiconductor substrate SB by using the ion implantation method to form a p type well which is a p type semiconductor region extending from the upper surface of the semiconductor substrate SB to the intermediate depth of the semiconductor substrate SB. The p type well is formed by implanting p type impurities (such as B (boron)). Subsequently, the insulating film IF1, the metal film MF1, the ferroelectric film FE and the insulating film IF2 are formed on the semiconductor substrate SB. The metal film MF1 is, for example, a TiN (titanium nitride) film, and can be formed by using, for example, the CVD method or the sputtering method.

Subsequently, the plurality of trenches (isolation trenches) D1 extending from the upper surface of the stacked film constituted by the insulating film IF1, the metal film MF1, the ferroelectric film FE and the insulating film IF2 to the intermediate depth of the semiconductor substrate SB are formed by using the photolithography technique and the dry etching method.

Next, as shown in FIG. 20, an insulating film embedded in each of the plurality of trenches D1 is formed. Then, the insulating film outside each of the plurality of trenches D1 is removed. In other words, the upper surface of the insulating film IF2 is exposed from the insulating film by performing the polishing process using, for example, the CMP method. Subsequently, the insulating film IF2 is removed to expose the upper surface of the ferroelectric film FE and retract the upper surface of the insulating film IF3 by performing etch back. As a result, the element isolation region EI constituted by the above-described insulating film remaining in each of the trenches D1 is formed.

Next, as shown in FIGS. 17 and 18, the metal film MF2 and the polysilicon film are formed in this order on the semiconductor substrate SB (on the element isolation region EI and on the metal film MF). The metal film MF2 is, for example, a TiN (titanium nitride) film, and can be formed by using, for example, the CVD method or the sputtering method. The polysilicon film is formed so as to cover the upper surface of each of the element isolation region EI and metal film MF2.

Next, the control gate electrode CG is formed by patterning the metal film MF2 and the polysilicon film, and subsequently, the source and drain regions SR and DR are formed in the upper surface of the semiconductor substrate SB in the active region to form the memory cell of the ferroelectric memory. The stacked film constituted by the metal film MF2 and the control gate electrode CG is formed as a pattern extending in the Y direction by this patterning. The stacked film extends over the element isolation regions EI aligned in the Y direction and over the semiconductor substrate SB in the active region between these element isolation regions EI.

As a result, the memory cell of the ferroelectric memory constituted by the MISFET (MIS type field effect transistor) including the ferroelectric film FE, the metal film MF1, the control gate electrode CG, the metal film MF2 and the source and drain regions SR and DR is formed. Then, although not shown, the interlayer insulating film covering the ferroelectric memory, the plug penetrating the interlayer insulating film, and the wiring on the plug are formed to substantially complete the semiconductor device of the present modification example.

As in the present modification example, even in the memory cell of the ferroelectric memory having a MFMIS structure, the above-described effects of the present embodiment can be obtained by not forming the ferroelectric film FE1 on the element isolation region EI.

In addition, in the ferroelectric memory having the MFMIS structure, capacitive coupling can be further improved by making the upper metal film MF2 and the ferroelectric film FE thinner than the lower metal film MF1 and the insulating film IF1 when forming the control gate electrode CG, as described in Non-patent Document 1.

In addition, the electric field applied to the insulating film IF1 can be made uniform by adopting the ferroelectric memory having the MFMIS structure instead of the MFIS structure.

Second Embodiment

Hereinafter, a case where the ferroelectric film is formed on the active region and on the element isolation region, and then the ferroelectric film on the element isolation region is removed by the polishing process will be described with reference to FIGS. 21 to 24. FIGS. 21 to 24 are cross-sectional views of the semiconductor device of the present embodiment in the manufacturing process. FIGS. 21 to 24 show cross sections taken along the gate width direction of the memory cell to be formed.

Figure 21:
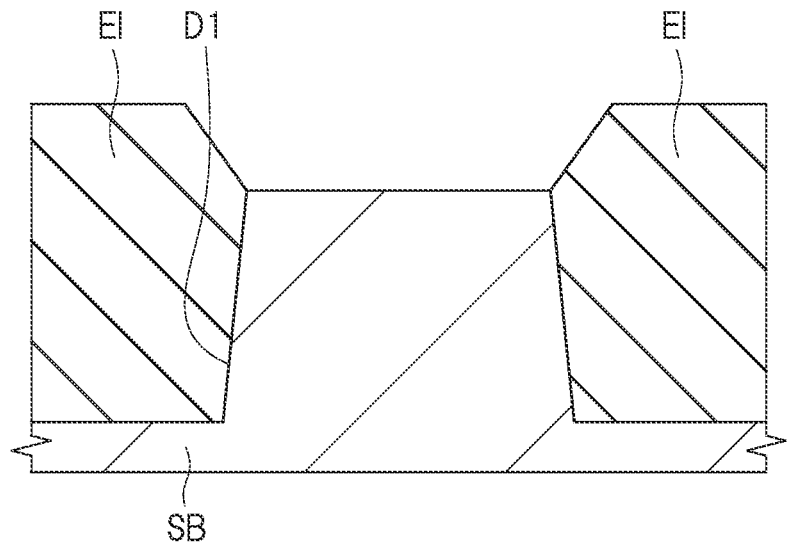
FIG. 21 is a cross-sectional view of the semiconductor device according to a second embodiment of the present invention in a manufacturing process.

In the manufacturing process of the semiconductor device of the present embodiment, first, as shown in FIG. 21, the semiconductor substrate SB is prepared, then the plurality of trenches D1 are formed in the upper surface of the semiconductor substrate SB, and the element isolation region EI is formed in each of the trenches D1. The element isolation region EI can be formed by a known method.

Namely, for example, a stacked film constituted by a silicon oxide film and a silicon nitride film formed in this order on the upper surface of the semiconductor substrate SB is formed, and then the stacked film is patterned by using the photolithography technique and the dry etching method. Next, the upper surface of the semiconductor substrate SB exposed from the stacked film is dug down by dry etching to form the plurality of trenches D1, and then the silicon oxide film is embedded in each of the trenches D1. Subsequently, an upper surface of the silicon oxide film is polished by the CMP method or the like to expose an upper surface of the silicon nitride film, and then the upper surface of the silicon oxide film is selectively retracted downward by a wet etching method. Here, a height of the retracted upper surface of the silicon oxide film is higher than a lower surface of the silicon nitride film. As a result, the element isolation region EI constituted by the silicon oxide film is formed. Then, the silicon nitride film and the silicon oxide film below the silicon nitride film are removed to expose the upper surface of the semiconductor substrate SB in the active region.

As shown in FIG. 21, a height of the upper surface of the element isolation region EI is higher than a height of the upper surface of the semiconductor substrate SB in the active region. Here, it is necessary for a difference in height between the upper surface of the element isolation region EI and the upper surface of the semiconductor substrate SB in the active region to have a certain magnitude. Specifically, it is necessary for the difference in height to be larger than a total film thickness of the ferroelectric film FE and the metal film MF formed in the process described below with reference to FIG. 22.

Figure 22:
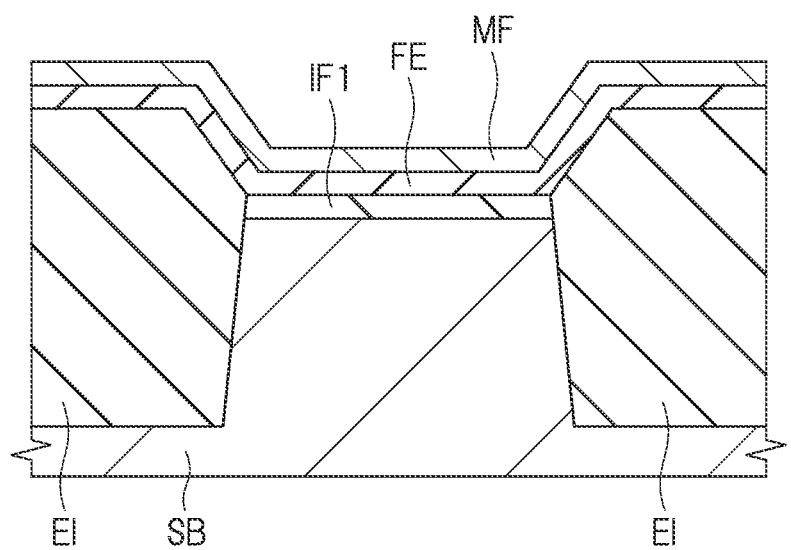
FIG. 22 is a cross-sectional view of the semiconductor device in the manufacturing process continued from FIG. 21.

Next, as shown in FIG. 22, the upper surface of the semiconductor substrate SB in the active region is oxidized to form the insulating film IF1. Subsequently, the ferroelectric film FE and the metal film MF are deposited in this order on the semiconductor substrate SB, that is, on the insulating film IF1 and on the element isolation region EI. At this time, the height of the upper surface of the metal film MF in the active region, that is, the metal film MF just above the upper surface of the semiconductor substrate SB exposed from the element isolation region EI is lower than a height of an uppermost surface of the element isolation region EI.

Figure 23:
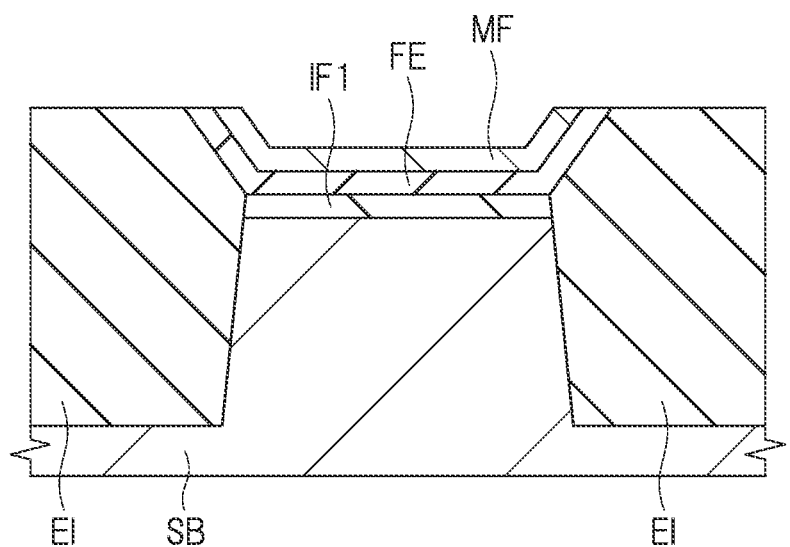
FIG. 23 is a cross-sectional view of the semiconductor device in the manufacturing process continued from FIG. 22.

Next, as shown in FIG. 23, a portion of the ferroelectric film FE and a portion of the metal film MF are removed by performing the polishing process using, for example, the CMP (Chemical Mechanical Polishing) method or the like, and the upper surface of the element isolation region EI is exposed in this manner. In other words, the ferroelectric film FE and the metal film MF on the element isolation region EI are removed. Note that the stacked film constituted by the ferroelectric film FE and the metal film MF remain on the semiconductor substrate SB in the active region between the adjacent element isolation regions EI.

Figure 24:
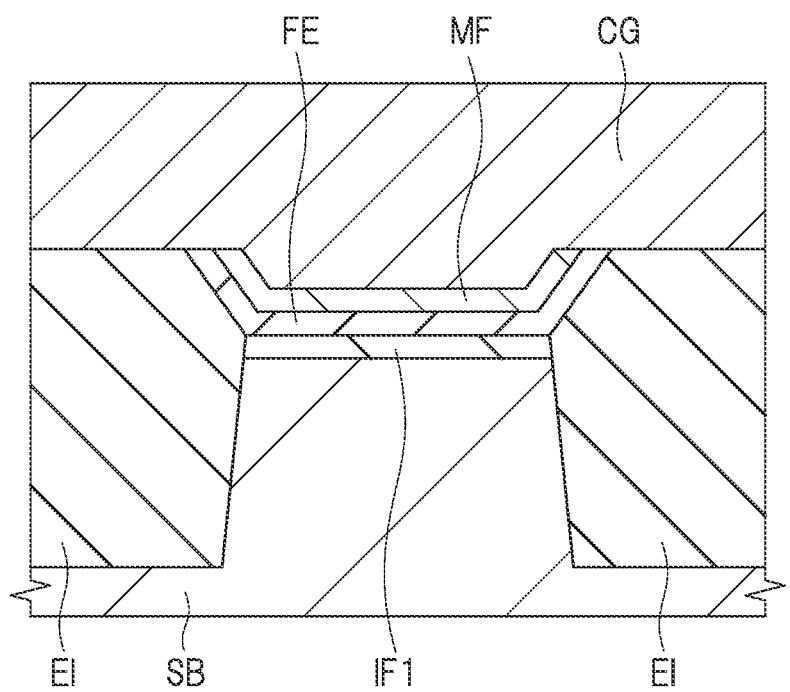
FIG. 24 is a cross-sectional view of the semiconductor device in the manufacturing process continued from FIG. 23.

Next, as shown in FIG. 24, the polysilicon film is formed on the semiconductor substrate SB, that is, on the stacked film and on the element isolation region EI. Subsequently, the polysilicon film is patterned to form the control gate electrode CG.

Then, although not shown, the source and drain regions are formed in the upper surface of the semiconductor substrate SB in the active region so as to sandwich the control gate electrode CG in plan view to form the memory cell.

In the present embodiment, the ferroelectric film FE and the metal film MF on the element isolation region EI are removed by the polishing process, and the ferroelectric film FE and the metal film MF remain only in the active region. This prevents an occurrence of a situation in which the polarization states differ between the ferroelectric film FE on the element isolation region EI and the ferroelectric film FE on the active region. Therefore, it is possible to prevent deterioration of retention characteristics of the memory cell and an increase in erroneous write and erroneous erase. As a result, performance of the semiconductor device can be enhanced.

In addition, in the present embodiment, the element isolation region EI is formed, and then the ferroelectric film FE is formed. For this reason, it is possible to prevent the ferroelectric film FE from being affected by a heat treatment performed when the element isolation region EI is formed.

In addition, in the present embodiment, the ferroelectric film FE and the metal film MF are each partially removed by the polishing process, whereby there is no need to prepare an additional photolithography mask compared to the case of manufacturing the memory cell of the comparative example shown in FIG. 33. Therefore, it is possible to prevent the manufacturing process of the semiconductor device from becoming complicated, and prevent an increase in the manufacturing cost.

In addition, the boundary between the element isolation region EI and the ferroelectric film FE is determined by self-aligning, whereby there is no need to consider exposure deviation in photolithography.

Third Embodiment

Hereinafter, a case where the ferroelectric film is formed on the active region and on the element isolation region, and then the ferroelectric film is patterned to remove the ferroelectric film on the element isolation region will be described with reference to FIGS. 25 to 28. FIGS. 25 to 28 are cross-sectional views of the semiconductor device of the present embodiment in the manufacturing process. FIGS. 25 to 28 show cross sections taken along the gate width direction of the memory cell to be formed.

Figure 25:
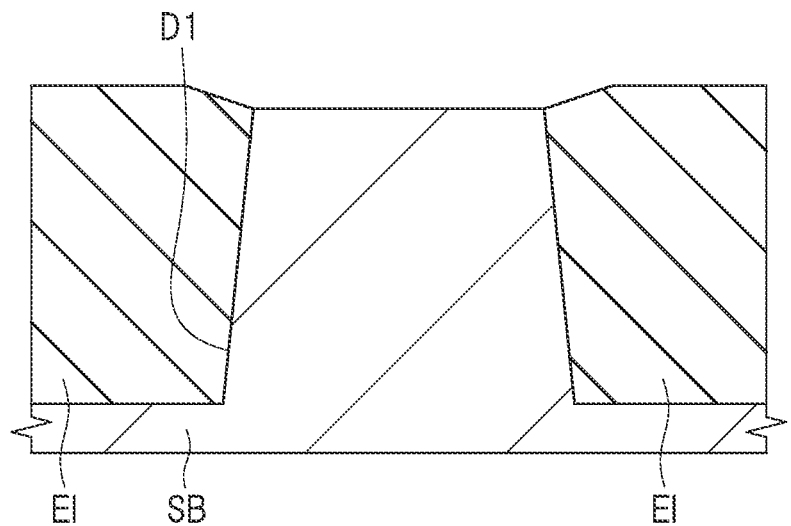
FIG. 25 is a cross-sectional view of the semiconductor device according to a third embodiment of the present invention in a manufacturing process.

In the manufacturing method of the semiconductor device of the present embodiment, first, as shown in FIG. 25, the semiconductor substrate SB is prepared, then the plurality of trenches D1 are formed in the upper surface of the semiconductor substrate SB, and the element isolation region EI is formed in each of the trenches D1. The element isolation region EI can be formed by a known method.

Figure 26:
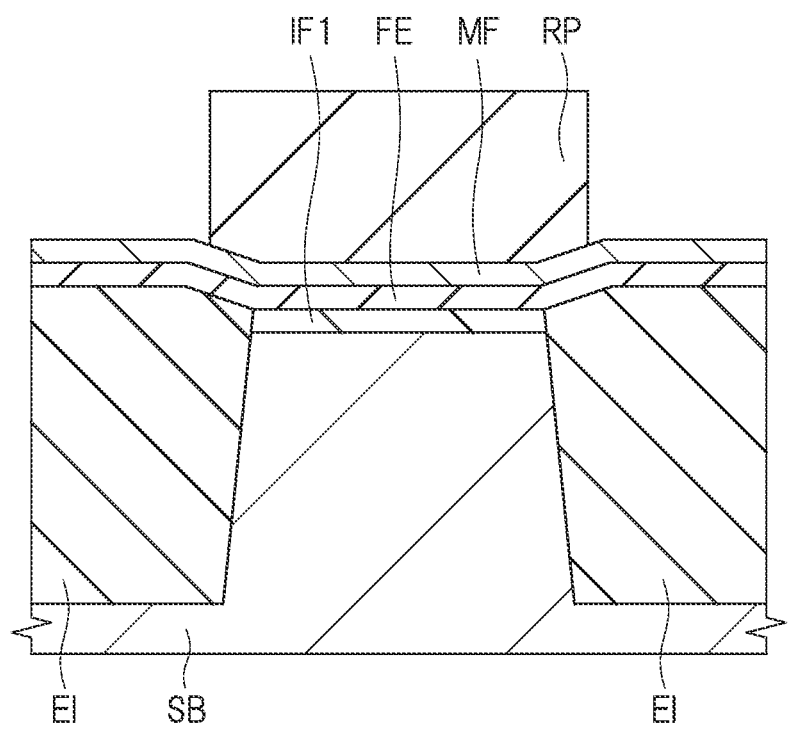
FIG. 26 is a cross-sectional view of the semiconductor device in the manufacturing process continued from FIG. 25.

Next, as shown in FIG. 26, the upper surface of the semiconductor substrate SB in the active region is oxidized to form the insulating film IF1. Subsequently, the ferroelectric film FE and the metal film MF are deposited in this order on the semiconductor substrate SB, that is, on the insulating film IF1 and on the element isolation region EI.

Subsequently, a resist pattern RP is formed on the metal film MF by using the photolithography technique. The resist pattern RP is a pattern that is constituted by a photo resist film, covers the upper surface of the semiconductor substrate SB in the active region, and exposes the upper surface of the element isolation region EI except for the upper surface of the element isolation region EI adjacent to the active region in plan view. Here, the resist pattern RP covers not only the region of the active region in which the control gate electrode CG is later formed, but also the region in which the source and drain regions are later formed. Namely, the resist pattern RP continuously covers the upper surface of the semiconductor substrate SB in the active region over the portion between the adjacent element isolation regions EI in the Y direction, and exposes the upper surface of the element isolation region EI except for the portion in the vicinity of the active region.

Figure 27:
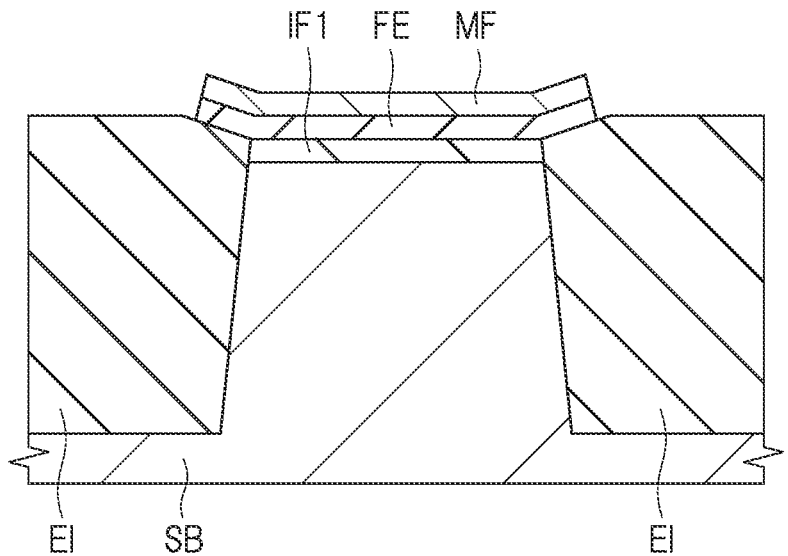
FIG. 27 is a cross-sectional view of the semiconductor device in the manufacturing process continued from FIG. 25.

Next, as shown in FIG. 27, the metal film MF and the ferroelectric film FE are patterned by performing dry etching using the resist pattern RP as a mask (etching prevention mask), and then the resist pattern RP is removed. The upper surface of the element isolation region EI is exposed from the metal film MF and the ferroelectric film FE by this patterning.

Figure 28:
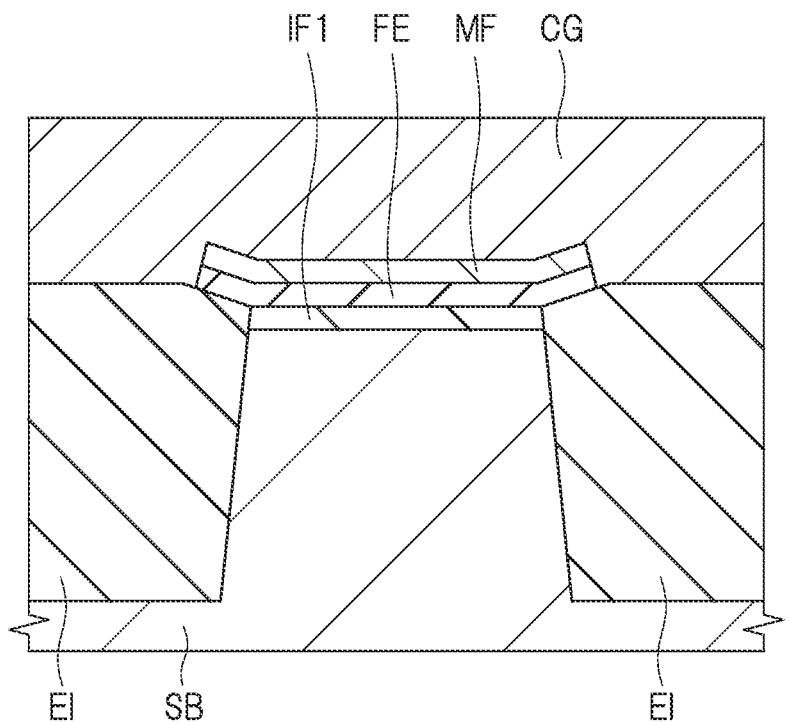
FIG. 28 is a cross-sectional view of the semiconductor device in the manufacturing process continued from FIG. 27.

Next, as shown in FIG. 28, the polysilicon film is formed on the semiconductor substrate SB, that is, on the metal film MF and on the element isolation region EI. Subsequently, the polysilicon film is patterned to form the control gate electrode CG. In this patterning process, the polysilicon film is patterned, then the metal film MF and the ferroelectric film FE are patterned, and as a result, the upper surface of the semiconductor substrate SB in the active region sandwiching the control gate electrode CG in plan view is exposed.

Then, although not shown, the source and drain regions are formed in the upper surface of the semiconductor substrate SB in the active region so as to sandwich the control gate electrode CG in plan view to form the memory cell.

In the present embodiment, the ferroelectric film FE and the metal film MF on the element isolation region EI are removed by etching using the resist pattern RP, and the ferroelectric film FE and the metal film MF remain only in the active region. This prevents an occurrence of a situation in which the polarization states differ between the ferroelectric film FE on the element isolation region EI and the ferroelectric film FE on the active region. Therefore, it is possible to prevent deterioration of retention characteristics of the memory cell and an increase in erroneous write and erroneous erase. As a result performance of the semiconductor device can be enhanced.

In addition, in the present embodiment, the element isolation region EI is formed, and then the ferroelectric film FE is formed. For this reason, it is possible to prevent the ferroelectric film FE from being affected by the heat treatment performed when the element isolation region EI is formed.

In addition, in the present embodiment, the ferroelectric film FE and the metal film MF on the element isolation region EI are removed by using the photolithography technique and the etching method, and a desired shape of the ferroelectric film FE and the metal film MF can be obtained by only using commonly used techniques. Thus, patterning is performed by the common technique, whereby a low-withstand voltage transistor formed in the CPU circuit or the like and a high-withstand voltage transistor formed in the I/O circuit or the like can be easily formed.

<Modification Example>

Figure 36:
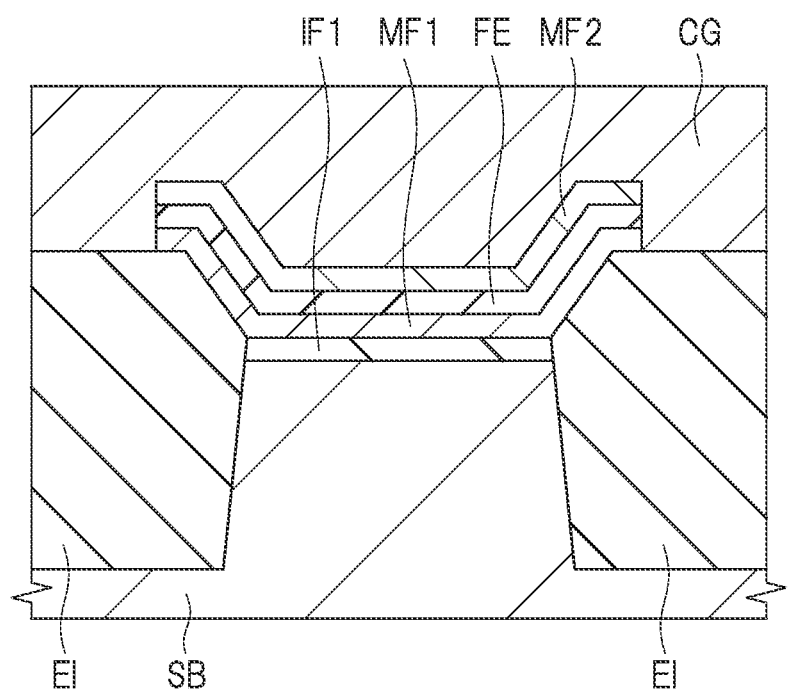
FIG. 36 is a cross-sectional view of the semiconductor device according to the comparative example in a manufacturing process.

In a case where the ferroelectric memory having the MFMIS structure is applied to the present embodiment, the following process may be considered. In other words, as described with reference to FIG. 25, the element isolation region EI formed, and then, as shown in FIG. 36 as the comparative example, the stacked film constituted by the metal film MF1, the ferroelectric film FE and the metal film MF2 deposited in this order on the element isolation region EI and on the semiconductor substrate SB is formed. Subsequently, the stacked film is patterned, the stacked film on the element isolation region EI is removed, and then the control gate electrode CG is formed on the stacked film and on the element isolation region EI. In such a case, a portion of the control gate electrode CG is in contact with the metal film MF1 at a side surface of the stacked film, and the metal films MF1 and MF2 short-circuit each other. As a result, the memory cell of the ferroelectric memory would not be able to obtain the desired characteristics. Therefore, in the ferroelectric memory having the MFMIS structure, it is necessary to devise a method to prevent the metal films MF1 and MF2 from short-circuiting each other.

Thus, in the present modification example, a case where the manufacturing method described with reference to FIGS. 21 to 24 and the manufacturing method described with reference to FIGS. 25 to 28 are combined to prevent the above-described short-circuiting, and effects of improving performance of the semiconductor device by not forming the ferroelectric film FE on the element isolation region EI will be described.

Hereinafter, a case where the ferroelectric film on the element isolation region is remove when the ferroelectric memory having the MFMIS structure will be described with reference to FIGS. 29 to 32. FIGS. 29 to 32 are cross-sectional views of the semiconductor device of the present modification example in the manufacturing process. FIGS. 29 to 32 show cross sections taken along the gate width direction of the memory cell to be formed.

In the manufacturing process of the semiconductor device of the present modification example, first, the element isolation region EI having the upper surface located at a position higher than the upper surface of the semiconductor substrate SB in the active region is formed by performing the same process described above with reference to FIG. 21. It is necessary for the difference in height between the upper surface of the element isolation region EI and the upper surface of the semiconductor substrate SB in the active region to be larger than a film thickness of the metal film MF1 formed in the process described below with reference to FIG. 29.

Figure 29:
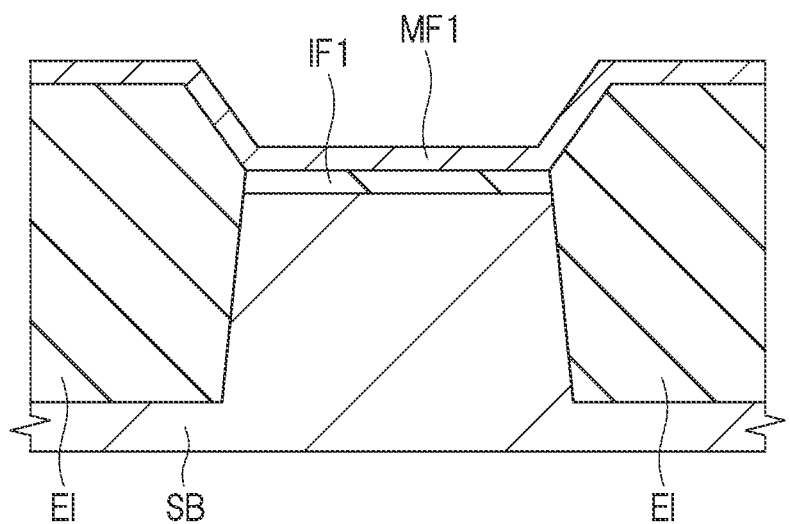
FIG. 29 is a cross-sectional view of the semiconductor device according to a modification example of the third embodiment of the present invention in a manufacturing process.

Next, as shown in FIG. 29, the upper surface of the semiconductor substrate SB in the active region is oxidized to form the insulating film IF1. Subsequently, the metal film MF1 is deposited on the semiconductor substrate SB, that is, on the insulating film IF1 and on the element isolation region EI. At this time, a height of an upper surface of the metal film MF1 in the active region is lower than the height of the uppermost surface of the element isolation region EI.

Figure 30:
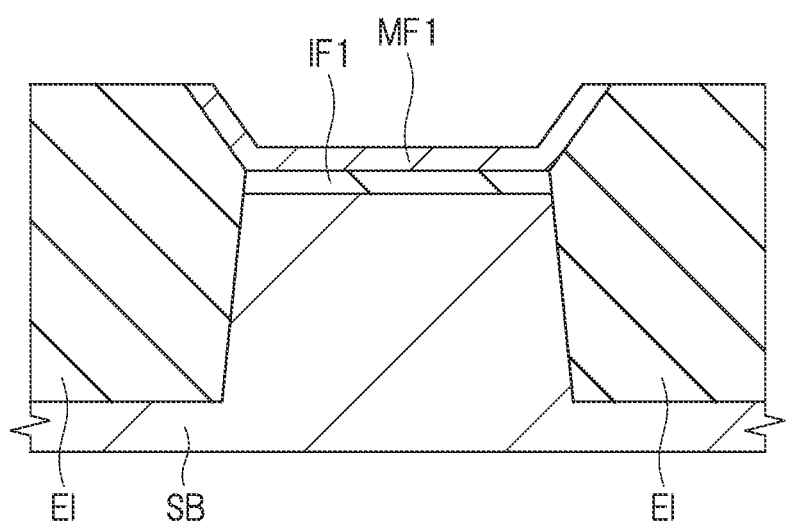
FIG. 30 is a cross-sectional view of the semiconductor device in the manufacturing process continued from FIG. 29.

Next, as shown in FIG. 30, a portion of the metal film MF1 is removed by performing the polishing process using, for example, the CMP method or the like, and the upper surface of the element isolation region EI is exposed in this manner. In other words, the metal film MF1 on the element isolation region EI is removed. Note that the metal film MF1 remains on the semiconductor substrate SB in the active region between the adjacent element isolation regions EI.

Figure 31:
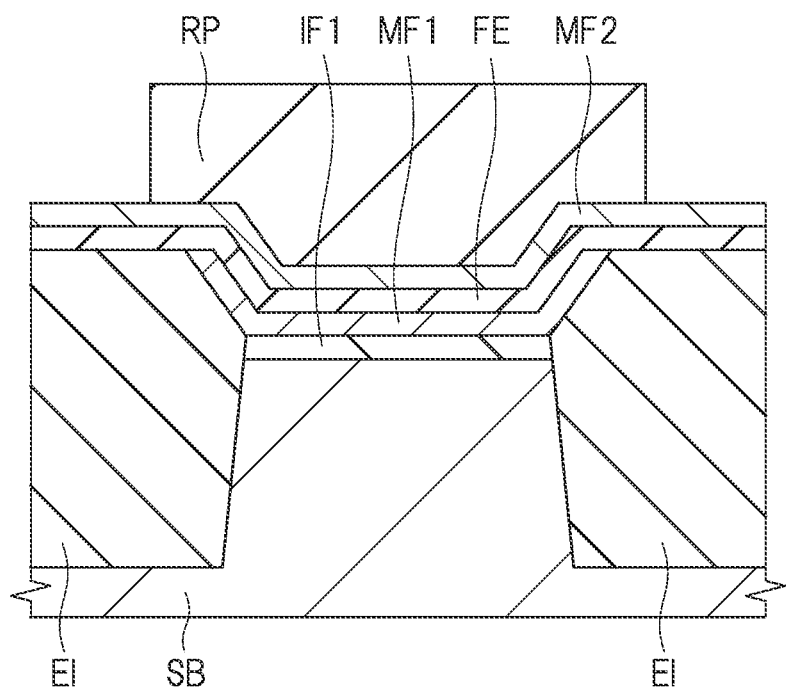
FIG. 31 is a cross-sectional view of the semiconductor device in the manufacturing process continued from FIG. 30.

Next, as shown in FIG. 31, the ferroelectric film FE and the metal film MF2 are formed in this order on the semiconductor substrate SB, that is, on the metal film MF1 and on the element isolation region EI.

Subsequently, the resist pattern RP is formed on the metal film MF2 by using the photolithography technique. The resist pattern RP is a pattern that is constituted by a photo resist film, covers the upper surface of the semiconductor substrate SB in the active region, and exposes the upper surface of the element isolation region EI except for the upper surface of the element isolation region EI adjacent to the active region in plan view. Here, the resist pattern RP covers not only the region of the active region in which the control gate electrode CG is later formed, but also the region in which the source and drain regions are later formed. Namely, the resist pattern EP continuously covers the upper surface of the semiconductor substrate SB in the active region over the portion between the adjacent element isolation regions EI in the Y direction and the upper surface of the metal film MF1, and exposes the upper surface of the element isolation region EI except for the portion in the vicinity of the active region. Both ends of the resist pattern RP in the Y direction terminate outside of the respective ends of the metal film MF1 in the Y direction.

Figure 32:
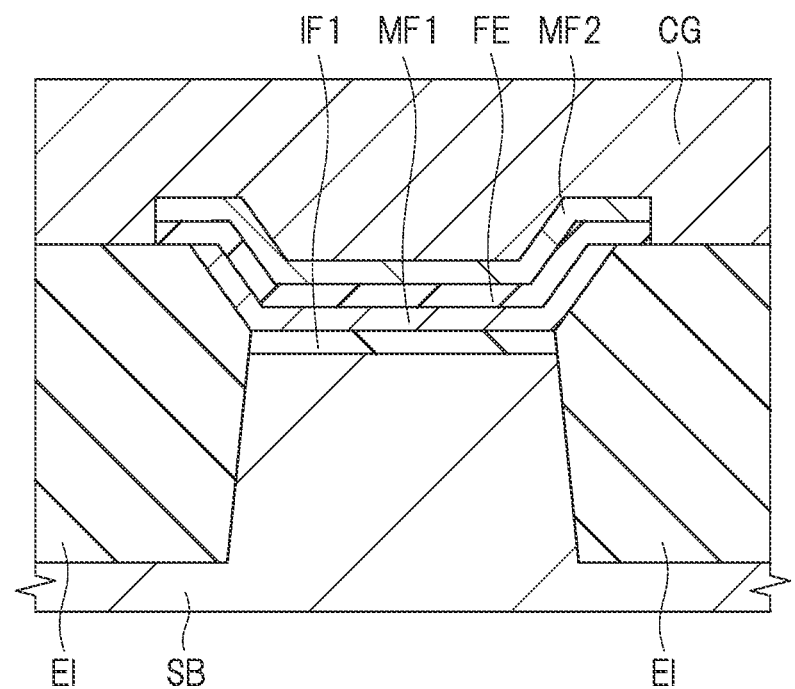
FIG. 32 is a cross-sectional view of the semiconductor device in the manufacturing process continued from FIG. 31.

Next, as shown in FIG. 32, the metal film MF2 and the ferroelectric film FE are patterned by performing dry etching using the resist pattern EP as a mask (etching prevention mask), and then the resist pattern EP is removed. The upper surface of the element isolation region EI is exposed from the metal film MF2 and the ferroelectric film FE by this patterning. At this time, both ends of the metal film MF2 and the ferroelectric film FE in the Y direction terminate outside of the respective ends of the metal film MF1 in the Y direction. In other words, the ferroelectric film FE covers the metal film MF1 from one end portion to the other end portion of the metal film MF in the Y direction. For this reason, the metal film MF1 is insulated with respect to the control gate electrode CG as described below.

Subsequently, the polysilicon film is formed on the semiconductor substrate SB, that is, on the metal film MF2 and on the element isolation region EI. Subsequently, the polysilicon film is patterned to form the control gate electrode CG. In this patterning process, the polysilicon film is patterned, then the metal film MF2, the ferroelectric film FE and the metal film MF1 are patterned, and as a result, the upper surface of the semiconductor substrate SB in the active region sandwiching the control gate electrode CG in plan view is exposed.

Then, although not shown, the source and drain regions are formed in the upper surface of the semiconductor substrate SB in the active region so as to sandwich the control gate electrode CG in plan view to form the memory cell.

In the present modification example, the metal film MF1 on the element isolation region EI is removed by the polishing process, and the ferroelectric film FE and the metal film MF2 on the element isolation region EI are removed by etching using the resist pattern RP. Here, the metal film MF1 on the element isolation region EI is removed by the polishing process, whereby the stacked pattern constituted by the ferroelectric film FE and the metal film MF2 formed later is not exposed from the metal film MF1. Therefore, it is possible to prevent a short circuit between the metal film MF1 and the metal film MF2 via the control gate electrode CG. In this manner, it is possible to have the ferroelectric film FE and the metal film MF remain only in the active region. This prevents an occurrence of a situation in which the polarization states differ between the ferroelectric film FE on the element isolation region EI and the ferroelectric film FE on the active region. Therefore, it is possible to prevent deterioration of retention characteristics of the memory cell and an increase in erroneous write and erroneous erase. As a result, performance of the semiconductor device can be enhanced.

In addition, in the ferroelectric memory having the MFMIS structure, capacitive coupling can be further improved by making the upper metal film MF2 and the ferroelectric film FE thinner than the lower metal film MF1 and the insulating film IF1 when forming the control gate electrode CG, as described in Non-patent Document 1.

In addition, the electric field applied to the insulating film IF1 can be made uniform by adopting the ferroelectric memory having the MFMIS structure instead of the MFIS structure.

In addition, in the present embodiment, the element isolation region EI is formed, and then the ferroelectric film FE is formed. For this reason, it is possible to prevent the ferroelectric film FE from being affected by the heat treatment performed when the element isolation region EI is formed.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the first to third embodiments, the memory cell constituted by the n type transistor has been described. However, the transistor may be formed as the p type transistor. In this case, it is sufficient to reverse the conductivity type of the well and the source/drain regions or the like constituting the transistor.

What is claimed is:

1. A manufacturing method of a semiconductor device, the method including the steps of:
   (a) preparing a semiconductor substrate;
   (b) forming a first insulating film and a first ferroelectric film in this order on the semiconductor substrate;
   (c) forming a first metal film on the first ferroelectric film;
   (d) patterning the first insulating film and the first ferroelectric film, and forming a plurality of trenches in an upper surface of the semiconductor substrate exposed in this manner;
   (e) embedding an element isolation region inside each of the plurality of trenches;
   (f) after the step (c) and the step (e), forming a gate electrode on the first metal film;
   (g) forming a source region and a drain region in the upper surface of the semiconductor substrate so as to sandwich the gate electrode in plan view,
   wherein the method further including the steps of:
      (h) after the step (e), forming a second insulating film that covers a side surface of a protruding portion which is a portion of the semiconductor substrate that protrudes more upward than the element isolation region between the plurality of trenches;
      (i) after the step (h), forming a second ferroelectric film and a third metal film in this order on the semiconductor substrate;
      (j) after the step (i), etching back the second ferroelectric film and the third metal film to expose an upper surface of the element isolation region; and
      (k) after the step (j) and before the step (f), forming a fourth metal film on the semiconductor substrate, and
   wherein the step (c) is performed after the step (b) and before the step (d),
   wherein, in the step (d), the protruding portion is formed so as to protrude upward between the plurality of trenches,
   wherein, in the step (e), the element isolation region is formed such that a portion including an upper end of the protruding portion is exposed on the upper surface, and
   wherein, in the step (f), the gate electrode is formed on the first metal film and on the fourth metal film such that an upper surface and the side surface of the protruding portion are covered by the gate electrode.

2. The manufacturing method according to claim 1,
   wherein, in the step (b), the first insulating film, a second metal film and the first ferroelectric film are formed in this order on the semiconductor substrate, and
   wherein, in the step (d), the first insulating film, the second metal film and the first ferroelectric film are patterned, and the plurality of trenches are formed in the upper surface of the semiconductor substrate exposed in this manner.

3. A manufacturing method of a semiconductor device, the method including the steps of:
   (a) preparing a semiconductor substrate;
   (b) forming a plurality of trenches in an upper surface of the semiconductor substrate, and forming an element isolation region in each of the plurality of trenches;
   (c) forming an insulating film, a ferroelectric film and a first metal film in this order on the semiconductor substrate;
   (d) removing the ferroelectric film and the first metal film just above the element isolation region;
   (e) after the step (d), forming a gate electrode on the first metal film; and
   (f) forming a source region and a drain region in the upper surface of the semiconductor substrate so as to sandwich the gate electrode in plan view,
   wherein the step (c) includes the steps of:
      (c1) forming the insulating film and a second metal film in this order on the semiconductor substrate;
      (c2) removing the second metal film just above the element isolation region by a polishing process; and
      (c3) after the step (c2), forming the ferroelectric film and the first metal film in this order on the semiconductor substrate, wherein, in the step (b), the element isolation region is formed such that a height of an uppermost surface of the element isolation region is higher than the upper surface of the semiconductor substrate exposed from the element isolation region, wherein, in the step (d), the ferroelectric film and the first metal film just above the element isolation region are removed by performing etching using a resist pattern as a mask, wherein the gate electrode extends in a first direction along the upper surface of the semiconductor substrate, and wherein both ends of the ferroelectric film in the first direction terminate outside of respective ends of the second metal film.

4. The manufacturing method according to claim 3, wherein, in the step (b), the element isolation region is formed such that a height of an uppermost surface of the element isolation region is higher than the upper surface of the semiconductor substrate exposed from the element isolation region, and wherein, in the step (d), the ferroelectric film and the first metal film just above the element isolation region are removed by a polishing process.

5. The manufacturing method according to claim 3, wherein, in the step (d), the ferroelectric film and the first metal film just above the element isolation region are removed by performing etching using a resist pattern as a mask.

6. The manufacturing method according to claim 3, wherein, in the step (b), the first insulating film, a second metal film and the first ferroelectric film are formed in this order on the semiconductor substrate, and wherein, in the step (d), the first insulating film, the second metal film and the first ferroelectric film are patterned, and the plurality of trenches are formed in the upper surface of the semiconductor substrate exposed in this manner.

7. The manufacturing method according to claim 3, further including the steps of:

(h) after the step (e), forming a second insulating film that covers a side surface of a protruding portion which is a portion of the semiconductor substrate that protrudes more upward than the element isolation region between the plurality of trenches;

(i) after the step (h), forming a second ferroelectric film and a third metal film in this order on the semiconductor substrate;

(j) after the step (i), etching back the second ferroelectric film and the third metal film to expose an upper surface of the element isolation region; and (k) after the step (j) and before the step (f), forming a fourth metal film on the semiconductor substrate, wherein the step (c) is performed after the step (b) and before the step (d), wherein, in the step (d), the protruding portion is formed so as to protrude upward between the plurality of trenches, wherein, in the step (e), the element isolation region is formed such that a portion including an upper end of the protruding portion is exposed on the upper surface, and wherein, in the step (f), the gate electrode is formed on the first metal film and on the fourth metal film such that an upper surface and the side surface of the protruding portion are covered by the gate electrode.

* * * * *